United States Patent
Song

(10) Patent No.: US 12,232,430 B2
(45) Date of Patent: Feb. 18, 2025

(54) SWITCHING DEVICE HAVING BI-DIRECTIONAL DRIVE CHARACTERISTICS AND METHOD OF OPERATING SAME

(71) Applicant: Samsung Electronics Co., Ltd., Suwon-si (KR)

(72) Inventor: Yun Heub Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 606 days.

(21) Appl. No.: 17/424,245

(22) PCT Filed: Dec. 31, 2019

(86) PCT No.: PCT/KR2019/018757
§ 371 (c)(1),
(2) Date: Jul. 20, 2021

(87) PCT Pub. No.: WO2020/153618
PCT Pub. Date: Jul. 30, 2020

(65) Prior Publication Data
US 2022/0069205 A1     Mar. 3, 2022

(30) Foreign Application Priority Data

Jan. 25, 2019   (KR) ................. 10-2019-0009648
Feb. 27, 2019   (KR) ................. 10-2019-0022893
Mar. 8, 2019    (KR) ................. 10-2019-0026845

(51) Int. Cl.
*H01L 23/535*     (2006.01)
*G06F 30/39*      (2020.01)
(Continued)

(52) U.S. Cl.
CPC ....... *H10N 70/231* (2023.02); *G11C 13/0004* (2013.01); *G11C 13/004* (2013.01);
(Continued)

(58) Field of Classification Search
CPC .. G11C 13/0004; G11C 13/00; H10N 70/231; H10N 70/826
See application file for complete search history.

(56) References Cited

U.S. PATENT DOCUMENTS

| 7,791,932 B2 | 9/2010 | Kuh et al. |
| 8,227,872 B2 | 7/2012 | Kim et al. |

(Continued)

FOREIGN PATENT DOCUMENTS

| CN | 102157540 A | 8/2011 |
| CN | 102891182 A | 1/2013 |

(Continued)

OTHER PUBLICATIONS

KR Office Action dated May 22, 2020 issued in corresponding KR Application No. 10-2019-0022893.

(Continued)

*Primary Examiner* — John A Bodnar
(74) *Attorney, Agent, or Firm* — Myers Bigel, P.A.

(57) ABSTRACT

Disclosed is a bi-directional two-terminal phase-change memory device using a tunneling thin film and a method of operating the same. According to an one embodiment, a phase-change memory device comprises: a first electrode; a second electrode; and a phase-change memory cell interposed between the first electrode and the second electrode, wherein the phase-change memory cell comprises: a P-type intermediate layer used as a data storage as a crystal state changes due to a voltage applied through the first electrode and the second electrode; an upper layer and a lower layer formed using an N-type semiconductor material at both ends of the intermediate layer; and at least one tunneling thin film disposed on at least one area from among an area between the upper layer and the intermediate layer or an area between the lower layer and the intermediate layer, so as to reduce a (Continued)

leakage current in the intermediate layer or prevent intermixing between a P-type dopant and an N-type dopant.

16 Claims, 27 Drawing Sheets

(51) Int. Cl.
*G06F 30/392* (2020.01)
*G11C 13/00* (2006.01)
*H01L 21/768* (2006.01)
*H01L 27/02* (2006.01)
*H01L 29/417* (2006.01)
*H01L 29/423* (2006.01)
*H01L 29/45* (2006.01)
*H01L 29/49* (2006.01)
*H01L 29/786* (2006.01)
*H10B 12/00* (2023.01)
*H10N 70/00* (2023.01)
*H10N 70/20* (2023.01)

(52) U.S. Cl.
CPC ......... *G11C 13/0069* (2013.01); *H10B 12/50* (2023.02); *H10N 70/841* (2023.02); *H10B 12/01* (2023.02); *H10N 70/883* (2023.02)

(56) References Cited

U.S. PATENT DOCUMENTS

| | | | |
|---|---|---|---|
| 8,456,900 B2 | 6/2013 | Lee et al. | |
| 8,956,929 B2 | 2/2015 | Egi et al. | |
| 9,136,388 B2 | 9/2015 | Yamazaki et al. | |
| 9,508,847 B2 | 11/2016 | Oh et al. | |
| 9,786,842 B1* | 10/2017 | Yan | G11C 13/0069 |
| 9,799,706 B2 | 10/2017 | Park et al. | |
| 2006/0121391 A1* | 6/2006 | Khang | H10N 70/231 430/270.13 |
| 2007/0184613 A1 | 8/2007 | Kim et al. | |
| 2011/0156020 A1 | 6/2011 | Jeon et al. | |
| 2011/0161605 A1* | 6/2011 | Lee | H10B 63/20 711/E12.001 |
| 2013/0069052 A1 | 3/2013 | Sandhu | |
| 2017/0358334 A1 | 12/2017 | Onuki | |
| 2020/0168792 A1 | 5/2020 | Song | |

FOREIGN PATENT DOCUMENTS

| | | | |
|---|---|---|---|
| CN | 107123683 A | 9/2017 | |
| KR | 100745761 B1 | 8/2007 | |
| KR | 100807230 B1 | 2/2008 | |
| KR | 20100130419 A | 12/2010 | |
| KR | 20110074354 A | 6/2011 | |
| KR | 20140116264 A | 10/2014 | |
| KR | 20160073143 A | 6/2016 | |
| KR | 101671860 B1 | 11/2016 | |
| KR | 1020170160268 | * 11/2017 | ............. H01L 45/06 |
| KR | 20180068527 A | 6/2018 | |
| KR | 20180133771 A | 12/2018 | |

OTHER PUBLICATIONS

"KR Office Action dated May 21, 2020 issued in corresponding KR Application No. 10-2019-0026845".

International Search Report corresponding to International Application No. PCT/KR2019/018757 (Dec. 31, 2019).

* cited by examiner

SWITCHING DEVICE HAVING BI-DIRECTIONAL DRIVE CHARACTERISTICS AND METHOD OF OPERATING SAME

CROSS REFERENCE TO RELATED APPLICATIONS

This application is a 35 U.S.C. § 371 national stage application of PCT International Application No. PCT/KR2019/018757, filed on Dec. 31, 2019, which claims priority to Korean Patent Application No. 10-2019-0009648, filed on Jan. 25, 2019, to Korean Patent Application No. 10-2019-0022893, filed on Feb. 27, 2019, and to Korean Patent Application No. 10-2019-0026845, filed on Mar. 8, 2019, with the entire disclosures of each above-identified application incorporated by reference herein.

TECHNICAL FIELD

The following embodiments relate to a selection device, and more particularly, to a technique of embodying a selection device configured to support a bi-directional switching operation.

BACKGROUND ART

With the rapid development of the information technology (IT) technology, there has been a need for advanced memory devices having characteristics such as ultrahigh speed, large capacity, and high integration density, which are appropriate for the development of portable information communication systems and devices that wirelessly process large amounts of information. Thus, although three-dimensional (3D) vertical (V)-NAND memories currently have the highest integration density, a string height increases as the number of stages increases, and thus, it is expected that achieving ultrahigh integration density will be limited by difficulties in a process of forming a high height of about 100 stages or more.

To replace the 3D V-NAND memories, advanced memory devices, such as spin-torque transfer-magnetic random access memory (STT-MRAM), ferroelectric RAM (Fe-RAM), resistive RAM (ReRAM), and phase-change RAM (PCRAM), and the like, which are superior to typical memory devices in power and data retention characteristics and write/read characteristics, have been studied.

Among these, PCRAM (hereinafter, phase-change memory) represents a change in a resistance status according to phase-change characteristics of a phase-change layer as a binary value, in response to the transfer of heat caused by the flow of a current or an applied voltage difference between a first electrode and a second electrode to the phase-change layer. In an example, as heat is transferred to the phase-change layer, the PCRAM changes a crystal state of the phase-change layer between a crystalline state and an amorphous state. Thus, the PCRAM may represent a binary value corresponding to each resistance status based on phase-change characteristics of having a low resistance in the crystalline state and having a high resistance in the amorphous state (e.g., the PCRAM has a set state of a binary value [0] when having a low resistance in the crystalline state of the phase-change layer, and has a rest state of a binary value [1] when having a high resistance in the amorphous state of the phase-change layer).

Because the phase-change memory is manufactured at low cost and capable of operating at high speed, intensive research has been conducted on phase-change memory for use as an advanced semiconductor memory device. Also, the phase-change memory has been proposed to be implemented as a structure in various 3D architectures in order to improve the two-dimensional (2D) scaling limit.

However, because a conventional ovonic threshold switch (OTS) used as a selection device in the phase-change memory requires an intermediate electrode located between the OTS and the phase-change layer, which are in contact with each other, the OTS has a disadvantage of being difficult in implementing high integration density in scaling and problems of material reliability due to the scaling and difficulty in blocking a leakage current.

Accordingly, developing of a selection device to replace a conventional OTS is required.

Moreover, in dynamic random access memory (DRAM), the improvement of a selection device due to the scaling of a memory cell is a very important problem. The performance of the selection device is closely related to a leakage current. That is, the DRAM has been researched and developed in the direction of securing the performance of the selection device by suppressing a leakage current.

Therefore, structures, such as a recessed channel array transistor (RCAT) and a buried word line (BWL), have been proposed, but sub-10-nm DRAM selection devices require device characteristics of dramatically suppressing a leakage current, which are different from those of the proposed structures.

Accordingly, it is necessary to propose a selection device that allows a substrate itself to have an extremely low leakage current.

DESCRIPTION OF EMBODIMENTS

Technical Problem

Embodiments propose a phase-change memory, which implements a selection device to replace a conventional ovonic threshold switch (OTS).

More specifically, embodiments propose a phase-change memory cell and a phase-change memory device, in which an NPN structure is configured with a P-type intermediate layer and an N-type upper layer and an N-type lower layer provided at both ends of the intermediate layer, so that bidirectional current drive may be implemented by forming bi-directional PN diodes using the NPN structure and simultaneously, a selection device configured to selectively switch a voltage applied from a first electrode and a second electrode to the intermediate layer using the bi-directional PN diodes may be implemented.

In this case, embodiments propose a phase-change memory cell and a phase-change memory device, in which a function of a data storage is integrated with a function of a selection device by configuring the selection device with a structure including an intermediate layer used as the data storage.

In particular, embodiments propose a phase-change memory cell and a phase-change memory device, in which at least one tunneling thin film is located in at least one area from among an area between an upper layer and an intermediate layer and an area between a lower layer and the intermediate layer to reduce a leakage current in the intermediate layer.

Furthermore, embodiments propose a phase-change memory cell and a phase-change memory device, which further reduce a leakage current by using a material having low leakage current characteristics as an N-type semiconductor material forming an upper layer and a lower layer.

In addition, embodiments propose a phase-change memory device in which a P-type phase-change layer and an N-type semiconductor layer form a PN diode by interposing the P-type phase-change layer and the N-type semiconductor layer between a first electrode and a second electrode, and a Schottky diode is formed at a contact interface between the P-type phase-change layer and the second electrode, so that the phase-change layer used as a data storage may be integrally implemented with a selection device and simultaneously, bi-directional current drive may be implemented.

In addition, embodiments propose a dynamic random access memory (DRAM) selection device and a method of manufacturing the same, in which an indium gallium zinc oxide (IGZO) channel structure is formed in a silicon substrate and used as at least a portion of a channel region of the DRAM selection device so that a substrate itself of the DRAM selection device may have an extremely low leakage current.

Solution to Problem

According to an embodiment, a phase-change memory device includes a first electrode; a second electrode; and a phase-change memory cell interposed between the first electrode and the second electrode. The phase-change memory cell includes a P-type intermediate layer used as a data storage as a crystal state changes due to a voltage applied through the first electrode and the second electrode; an upper layer and a lower layer formed using an N-type semiconductor material at both ends of the intermediate layer; and at least one tunneling thin film arranged in at least one area from among an area between the upper layer and the intermediate layer and an area between the lower layer and the intermediate layer, so as to reduce a leakage current in the intermediate layer or prevent intermixing between a P-type dopant and an N-type dopant.

According to an aspect, the at least one tunneling thin film may be formed using a material to have a thickness to reduce the leakage current or prevent intermixing between the P-type dopant and the N-type dopant and simultaneously, allow the flow of a tunneling current.

According to another aspect, the phase-change memory cell may be formed to have an NPN structure and selectively switch a voltage applied to the first electrode and the second electrode to the intermediate layer.

According to still another aspect, the phase-change memory cell may implement bi-directional current drive by forming bi-directional PN diodes using an NPN structure.

According to yet another aspect, the phase-change memory cell may perform a write operation of changing a crystal state of the intermediate layer as the intermediate layer is depleted due to an NP reverse bias in an NPN structure and a tunneling current flows.

According to yet another aspect, the phase-change memory cell performs a read operation of reading a voltage difference caused by a variation in a depletion turn-on voltage due to a change of the crystal state of the intermediate layer or performs a read operation of reading a read current based on a variation in a resistance of the intermediate layer.

According to yet another aspect, the intermediate layer may be formed using a phase-change material containing a transition metal to have reverse phase-change characteristics.

According to an embodiment, a phase-change memory having a three-dimensional (3D) architecture includes at least one first electrode formed to extend in a horizontal direction; a second electrode formed to extend in a direction perpendicular to the at least one first electrode; and at least one phase-change memory cell interposed between the at least one first electrode and the second electrode. Each of the at least one phase-change memory cell includes a P-type intermediate layer used as a data storage as a crystal state changes due to a voltage applied through the at least one first electrode and the second electrode; an upper layer and a lower layer formed using an N-type semiconductor material at both ends of the intermediate layer; and at least one tunneling thin film arranged in at least one area from among an area between the upper layer and the intermediate layer and an area between the lower layer and the intermediate layer, so as to reduce a leakage current in the intermediate layer or prevent intermixing between a P-type dopant and an N-type dopant.

According to an embodiment, a phase-change memory device including a first electrode; a second electrode; a P-type phase-change layer interposed between the first electrode and the second electrode and used as a data storage as a crystal state changes due to a voltage applied through the first electrode and the second electrode; and an N-type semiconductor layer arranged on the P-type phase-change layer. The P-type phase-change layer and the N-type semiconductor layer form a PN diode, and the P-type phase-change layer forms a Schottky diode at a contact interface with the second electrode.

According to an aspect, the phase-change memory device may implement bi-directional current drive by using the PN diode and the Schottky diode.

According to another aspect, the P-type phase-change layer may be formed using a phase-change material containing a transition metal to form a Schottky diode having stable Schottky characteristics at a contact interface with the second electrode.

According to an embodiment, a dynamic random access memory (DRAM) selection device configured to reduce a leakage current includes a silicon substrate; a word line buried in the silicon substrate; and an indium gallium zinc oxide (IGZO) channel structure formed in the silicon substrate to surround at least a portion of the word line. The IGZO channel structure is used as at least a portion of a channel region in the DRAM selection device.

According to an aspect, the depth at which the IGZO channel structure surrounds at least a portion of the word line may be determined as a value for allowing the IGZO channel structure to be used as at least the portion of a channel region in the DRAM selection device and/or a value for reducing the leakage current by a predetermined value or more in the DRAM selection device.

According to another aspect, the IGZO channel structure may be formed in the silicon substrate by using an atomic layer deposition (ALD) process or an epitaxial growth process.

According to still another aspect, the DRAM selection device may be provided and stacked in plural in a vertical direction or a horizontal direction to form a 3D structure.

Advantageous Effects of Disclosure

Embodiments may propose a phase-change memory that implements a selection device to replace a conventional ovonic threshold switch (OTS).

More specifically, embodiments may propose a phase-change memory cell and a phase-change memory device, in which an NPN structure is configured with a P-type intermediate layer and an N-type upper layer and an N-type lower layer provided at both ends of the intermediate layer, so that bidirectional current drive may be implemented by forming bi-directional PN diodes using the NPN structure and simultaneously, a selection device configured to selectively switch a voltage applied from a first electrode and a second electrode to the intermediate layer using the bi-directional PN diodes may be implemented.

In this case, embodiments may propose a phase-change memory cell and a phase-change memory device in which a function of a data storage is integrated with a function of a selection device by configuring the selection device using a structure including an intermediate layer used as the data storage.

In particular, embodiments may propose a phase-change memory cell and a phase-change memory device in which at least one tunneling thin film is located in at least one area from among an area between an upper layer and an intermediate layer and an area between a lower layer and the intermediate layer to reduce a leakage current in the intermediate layer.

Furthermore, embodiments may propose a phase-change memory cell and a phase-change memory device, which use a material having low leakage current characteristics as an N-type semiconductor material forming an upper layer and a lower layer and further reduce a leakage current.

In addition, embodiments may propose a phase-change memory device in which a P-type phase-change layer and an N-type phase-change layer form a PN diode by interposing the P-type phase-change layer and the N-type phase-change layer between a first electrode and a second electrode, and a Schottky diode is formed at a contact interface between the P-type phase-change layer and the second electrode, so that a phase-change layer used as a data storage may be integrally implemented with a selection device and simultaneously, bi-directional current drive may be implemented.

In addition, embodiments may propose a DRAM selection device and a method of manufacturing the same, in which an indium gallium zinc oxide (IGZO) channel structure is formed in a silicon substrate and used as at least a portion of a channel region of the DRAM selection device so that a substrate itself of the DRAM selection device may have an extremely low leakage current.

BEST MODE

Figure 1A:
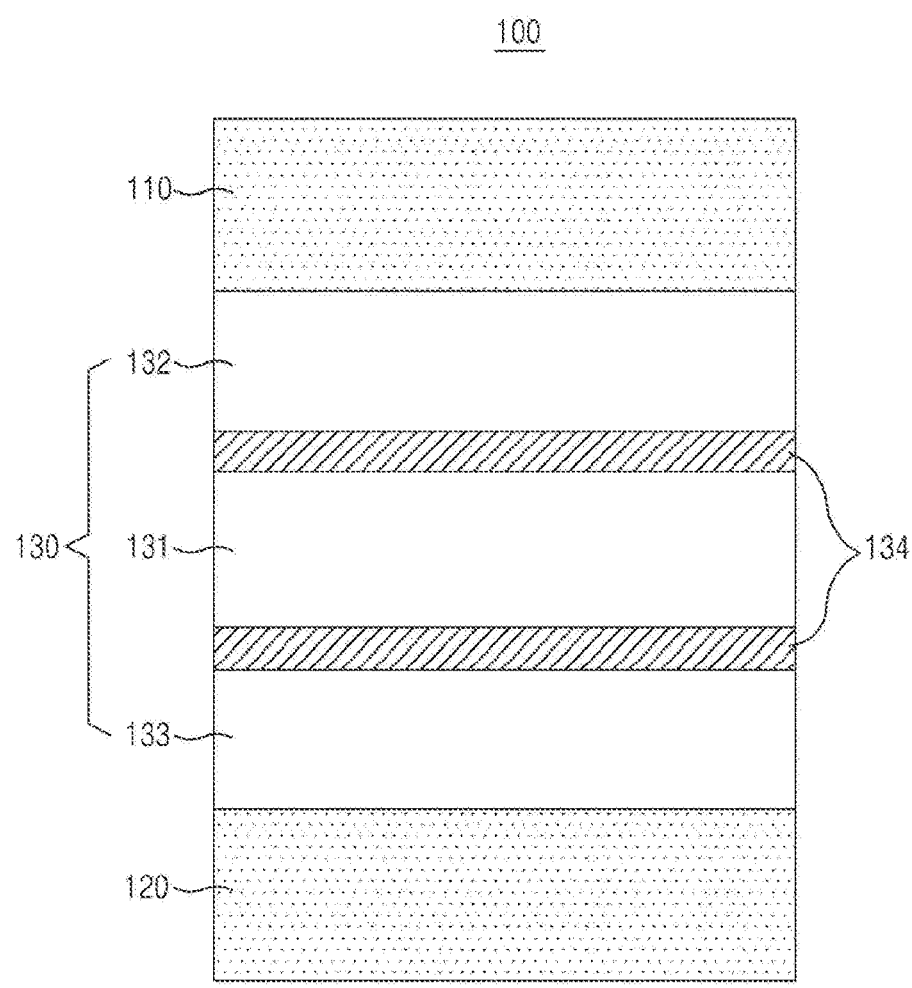
FIGS. 1A to 1C are diagrams of a phase-change memory device according to an embodiment.

Hereinafter, embodiments will be described in detail with reference to the accompanying drawings. However, the present disclosure is not limited by the embodiments. In addition, the same reference numerals shown in each drawing refer to the same elements.

Furthermore, the terminology used herein is for the purpose of appropriately describing example embodiments of the present disclosure, and may vary depending on the intention of users or operators or customs in the art to which the present disclosure belongs. Therefore, terms used herein should be defined based on contents of the entire present specification.

Figure 1B:
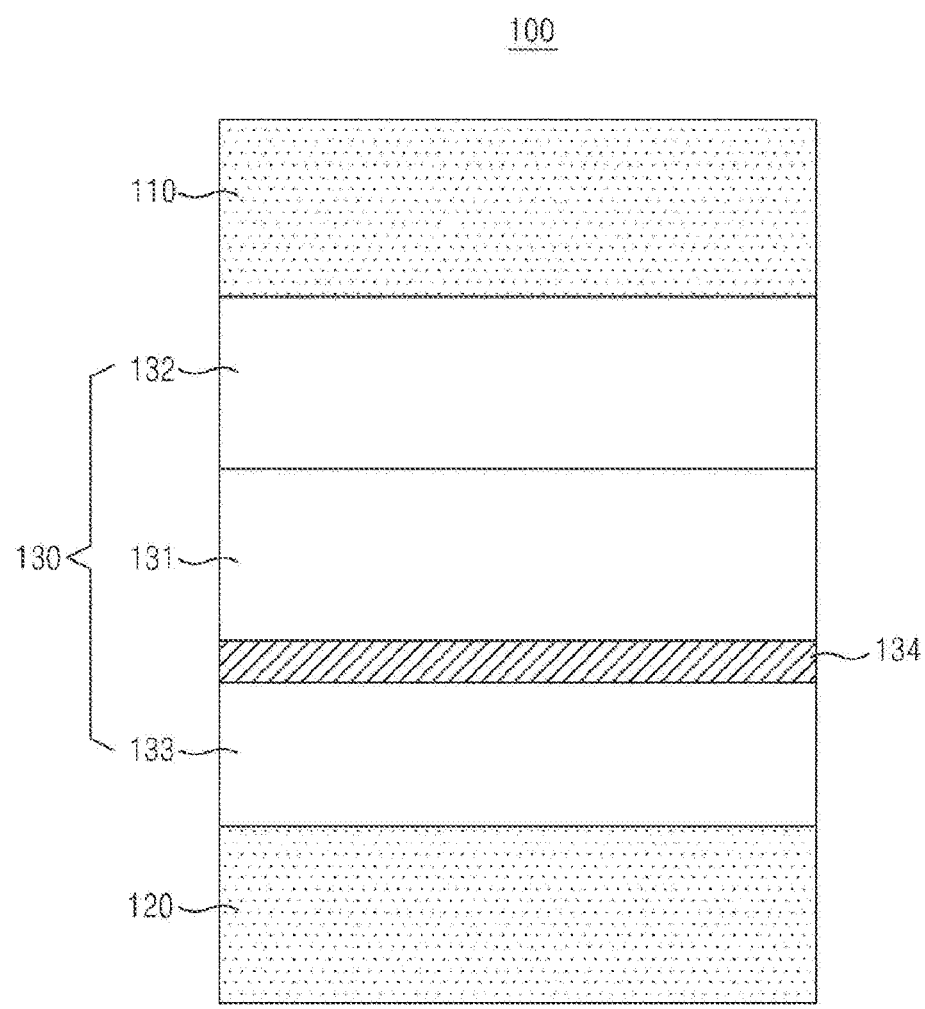
Figure 1C:
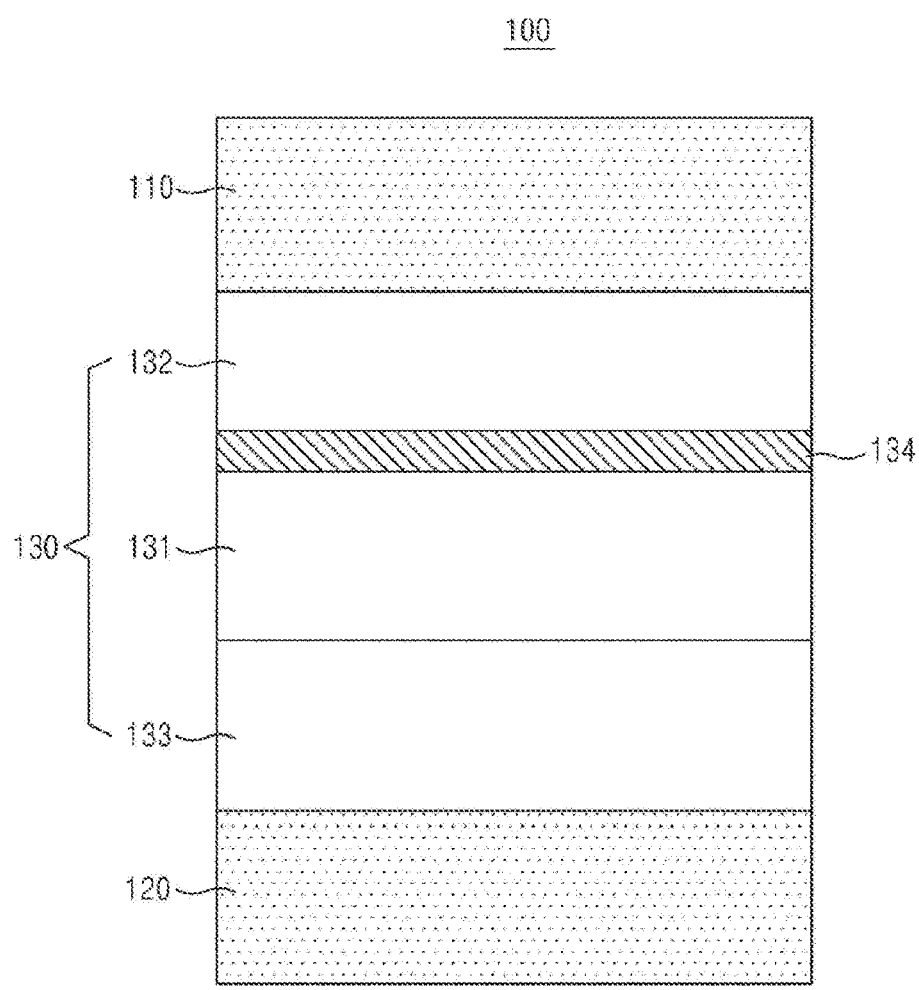
Figure 2:
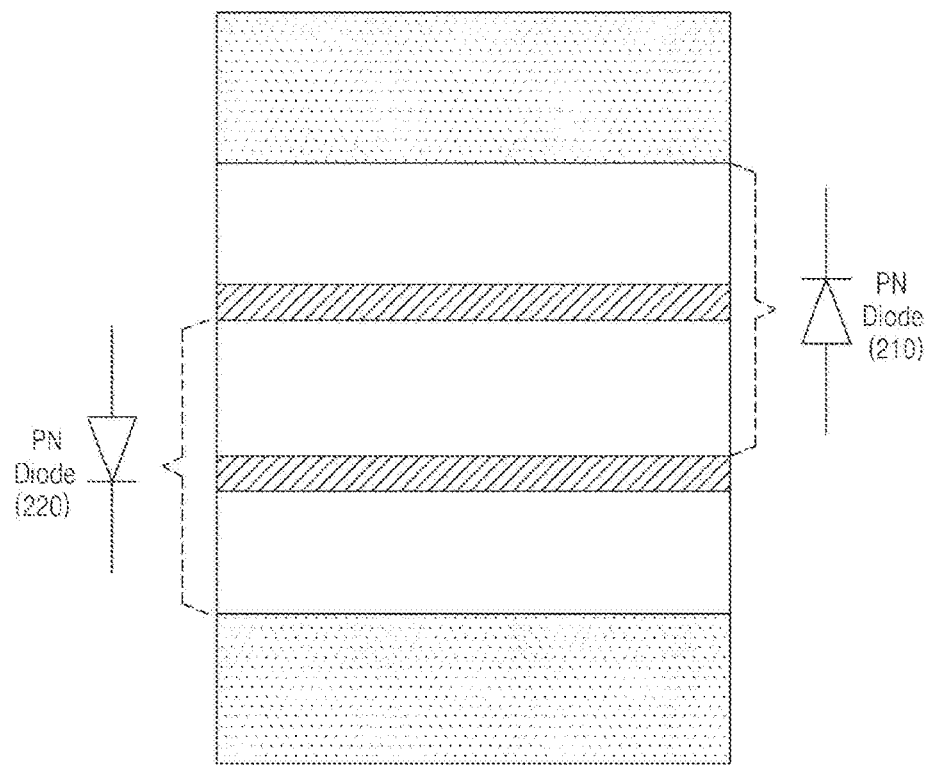
FIG. 2 is a diagram showing a phase-change memory device that implements bi-directional current drive according to an embodiment.
Figure 3:
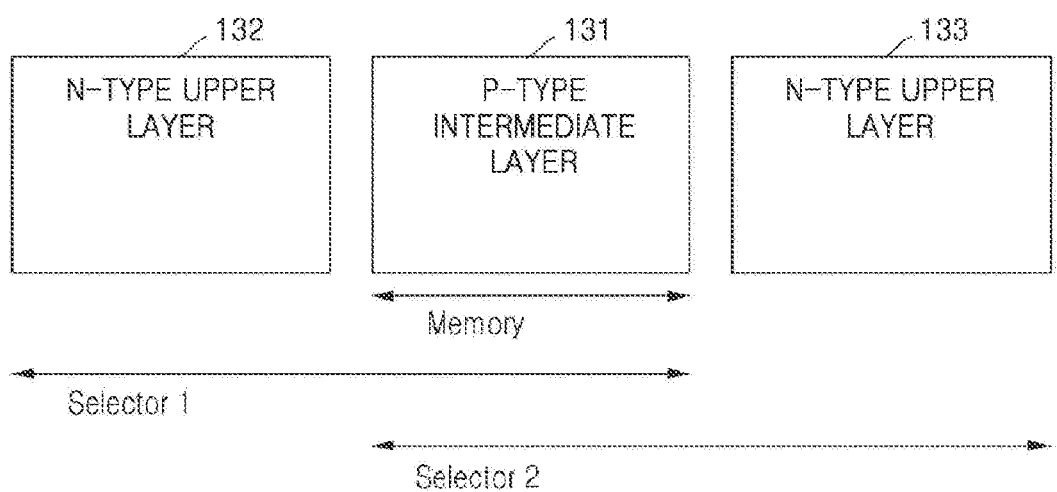
FIG. 3 is a diagram showing a selection device integrally implemented with a phase-change layer in a phase-change memory device according to an embodiment.
Figure 4:
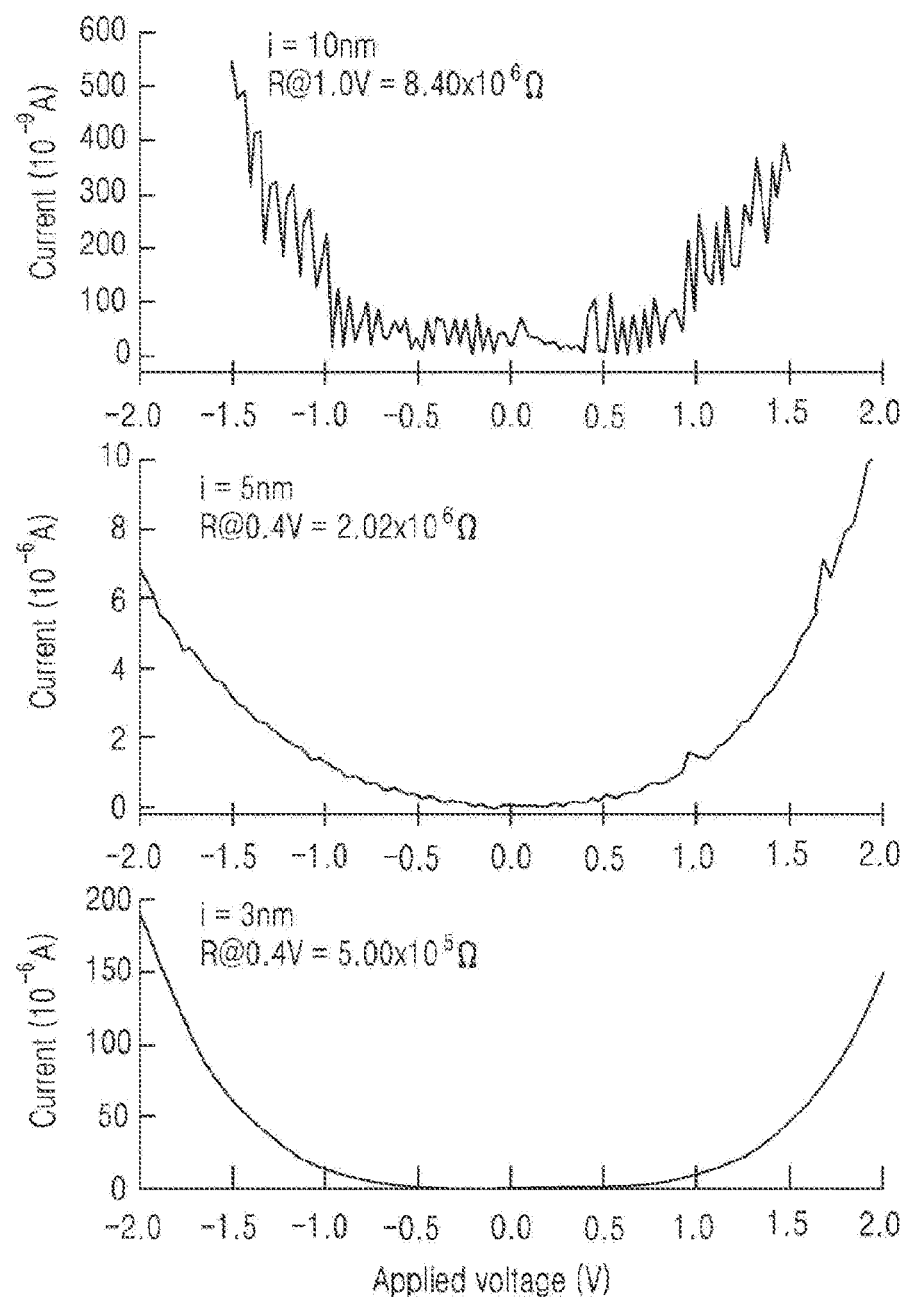
FIG. 4 is a diagram for explaining characteristics of a tunneling thin film included in a phase-change memory device according to an embodiment

FIGS. 1A to 1C are diagrams of a phase-change memory device according to an embodiment. FIG. 2 is a diagram showing a phase-change memory device that implements bi-directional current drive according to an embodiment. FIG. 3 is a diagram showing a selection device integrally implemented with a phase-change layer in a phase-change memory device according to an embodiment. FIG. 4 is a diagram for explaining characteristics of a tunneling thin film included in a phase-change memory device according to an embodiment.

Referring to FIGS. 1A to 4, a phase-change memory device 100 according to an embodiment includes a first electrode 110 and a second electrode 120, which are formed using a conductive metal material, such as tungsten (W), tantalum nitride (TaN), and titanium nitride (TiN), and a phase-change memory cell 130 interposed therebetween.

The phase-change memory cell 130 has a structure including a P-type intermediate layer 131, an N-type upper layer 132, a lower layer 133, and at least one tunneling thin film 134. Thus, the phase-change memory cell 130 may implement bi-directional current drive by forming bi-directional PN diodes 210 and 220 using an NPN structure. In an example, as shown in FIG. 2, the first PN diode 210 may be formed in a first direction by using the intermediate layer 131 and the upper layer 132, and the second PN diode 220 may be formed in a second direction, which is opposite to the first direction, by using the intermediate layer 131 and the lower layer 133. Thus, the phase-change memory cell 130 may implement the bi-directional current drive in the first direction and the second direction.

Here, the bi-directional PN diodes 210 and 220 may be used as a selection device configured to selectively switch a voltage applied through the first electrode 110 and the second electrode 120 to the P-type intermediate layer 131.

Accordingly, the phase-change memory cell 130 implements the bi-directional PN diodes 210 and 220, which operate as the selection device, based on the P-type intermediate layer 131 used as a data storage. Thus, a data storage function (or a function of representing data in a crystal state of the intermediate layer 131, which is changed due to a voltage applied through the first electrode 110 and the second electrode 120) may be integrated with a function of the selection device (or a function of selectively switching the voltage applied through the first electrode 110 and the second electrode 120 to the intermediate layer 131). That is, the P-type intermediate layer 131 may function as a data storage in the phase-change memory cell 130 as shown in FIG. 3 and simultaneously, also function as a selection device by forming the bi-directional diodes 210 and 220.

By integrally implementing the intermediate layer 131 used as the data storage with the selection device, the phase-change memory cell 130 may prevent and solve a disadvantage of being difficult in implementing high integration density in the scaling of a conventional OTS and a problem of material reliability due to the scaling.

The P-type intermediate layer 131 is used as a data storage as a crystal state changes due to a voltage applied through the first electrode 110 and the second electrode 120. That is, the intermediate layer 131 refers to a phase-change layer of which the crystal state changes between a crystalline state and an amorphous state due to the voltage applied through the first electrode 110 and the second electrode 120. As a constituent material, a material having typical phase-change characteristics (or characteristics of having a low resistance in the crystalline state and having a high resistance in the amorphous state) or a material having reverse phase-change characteristics (or characteristics of having a high resistance in the crystalline state and having a low resistance in the amorphous state) may be used. Hereinafter, having the high resistance in the crystalline state will refer to having a relatively high resistance based on a resistance obtained in the amorphous state, while having the low resistance in the amorphous state will refer to having a relatively low resistance based on a resistance obtained in the crystalline state.

For example, the intermediate layer 131 may be formed using a phase-change material containing a transition metal to have reverse phase-change characteristics. In this case, at least one of germanium (Ge), antimony (Sb), and tellurium (Te) may be used as the phase-change material, and at least one of chromium (Cr), titanium (Ti), nickel (Ni), zinc (Zn), copper (Cu), and molybdenum (Mo) may be used as the transition metal. A content ratio at which the transition metal is contained in the phase-change material may be adjusted to maximize a resistance ratio between a case in which the intermediate layer 131 is in the crystalline state and a case in which the intermediate layer 131 is in the amorphous state. For example, a content ratio at which a transition metal, such as chromium (Cr) (or titanium (Ti), nickel (Ni), zinc (Zn), copper (Cu), molybdenum (Mo), or the like), is contained in a phase-change material, such as germanium (Ge) and tellurium (Te), may be adjusted to have a weight percentage of less than 10% based on Ge and Te to maximize the resistance ratio between the case in which the intermediate layer 131 is in the crystalline state and the case in which the intermediate layer 131 is in the amorphous state.

The upper layer 132 and the lower layer 133 are formed using an N-type semiconductor material at both ends of the intermediate layer 131. For example, each of the upper layer 132 and the lower layer 133 may be formed using an N-type semiconductor material including at least one of Zn, In, and Ga having low leakage current characteristics, a Group-IV semiconductor material, or Group III-V compound. Here, a zinc oxide ($ZnO_x$)-based material may be used as the N-type semiconductor material, and may include at least one of aluminum-doped zinc oxide (AZO), zinc tin oxide (ZTO), indium zinc oxide (IZO), indium tin oxide (ITO), indium gallium zinc oxide (IGZO), and silver (Ag)—ZnO.

The at least one tunneling thin film 134 is arranged in at least one area from among an area between the upper layer 132 and the intermediate layer 131 or an area between the lower layer 133 and the intermediate layer 131 and reduces a leakage current in the intermediate layer 131 or prevents intermixing between a P-type dopant and an N-type dopant. In an example, the at least one tunneling thin film 134 may be arranged in both the area between the upper layer 132 and the intermediate layer 131 and the area between the lower layer 133 and the intermediate layer 131 as shown in FIG. 1A, be in only the area between the lower layer 133 and the intermediate layer 131 as shown in FIG. 1B, or be in the area between the upper layer 132 and the intermediate layer 131 as shown in FIG. 1C.

In particular, the at least one tunneling thin film 134 may be formed using a material to have a thickness to reduce the leakage current or prevent intermixing between the P-type dopant and the N-type dopant and simultaneously, allow the flow of a tunneling current. For example, the at least one tunneling thin film 134 may be formed using a material (e.g., a high-resistance material including at least one of $SiO_2$, $Si_3N_4$, SiON, and $AlO_x$) capable of minimizing a leakage current assuming that a tunneling current may flow. In another example, a thickness of the at least one tunneling thin film 134 may be adjusted based on a target value for reducing a leakage current or a target value for preventing intermixing between the P-type dopant and the N-type dopant. In this connection, referring to FIG. 4, it can be seen that a leakage current of the at least one tunneling thin film 134 is greatly reduced as a thickness of the at least one tunneling thin film 134 increases. Accordingly, the at least one tunneling thin film 134 may be formed to such a great thickness as to reduce the leakage current of the at least one tunneling thin film 134 is reduced to a target value assuming that the tunneling current may flow.

As described above, the phase-change memory cell 130 according to the embodiment has a structure including the at least one tunneling thin film 134, and thus, a leakage current in the intermediate layer 131 may be markedly reduced, and intermixing between the P-type dopant and the N-type dopant may be prevented. Furthermore, as described above, by using a material having low leakage current characteristics as a material that forms the upper layer 132 and the lower layer 133, the leakage current may be further reduced, and intermixing between the P-type dopant and the N-type dopant may be prevented.

The above-described characteristics of the phase-change memory cell 130 may also be wholly applied to the phase-change memory device 100 including the phase-change memory cell 130. Accordingly, the phase-change memory device 100 according to the embodiment may also integrally implement the intermediate layer 131 used as the data storage with the selection device and simultaneously, implement bi-directional current drive. Thus, a disadvantage of being difficult in implementing high integration density in the scaling of a conventional OTS and a problem of material reliability due to the scaling may be prevented and solved. Also, the phase-change memory device 100 includes the at least one tunneling thin film 134, and thus, the leakage current may be blocked and prevented and simultaneously, intermixing between the P-type dopant and the N-type dopant may be prevented.

In addition, although the phase-change memory cell 130 and the phase-change memory device 100 including the same, which are explained above, have been described as simplified structures, they may be implemented to have a highly integrated 3D architecture. A detailed description thereof will be presented with reference to FIG. 7.

In addition, the phase-change memory cell 130 described above and a write operation and a read operation performed by the phase-change memory device 100 including the same will be described below with reference to FIGS. 5 and 6.

Figure 5:
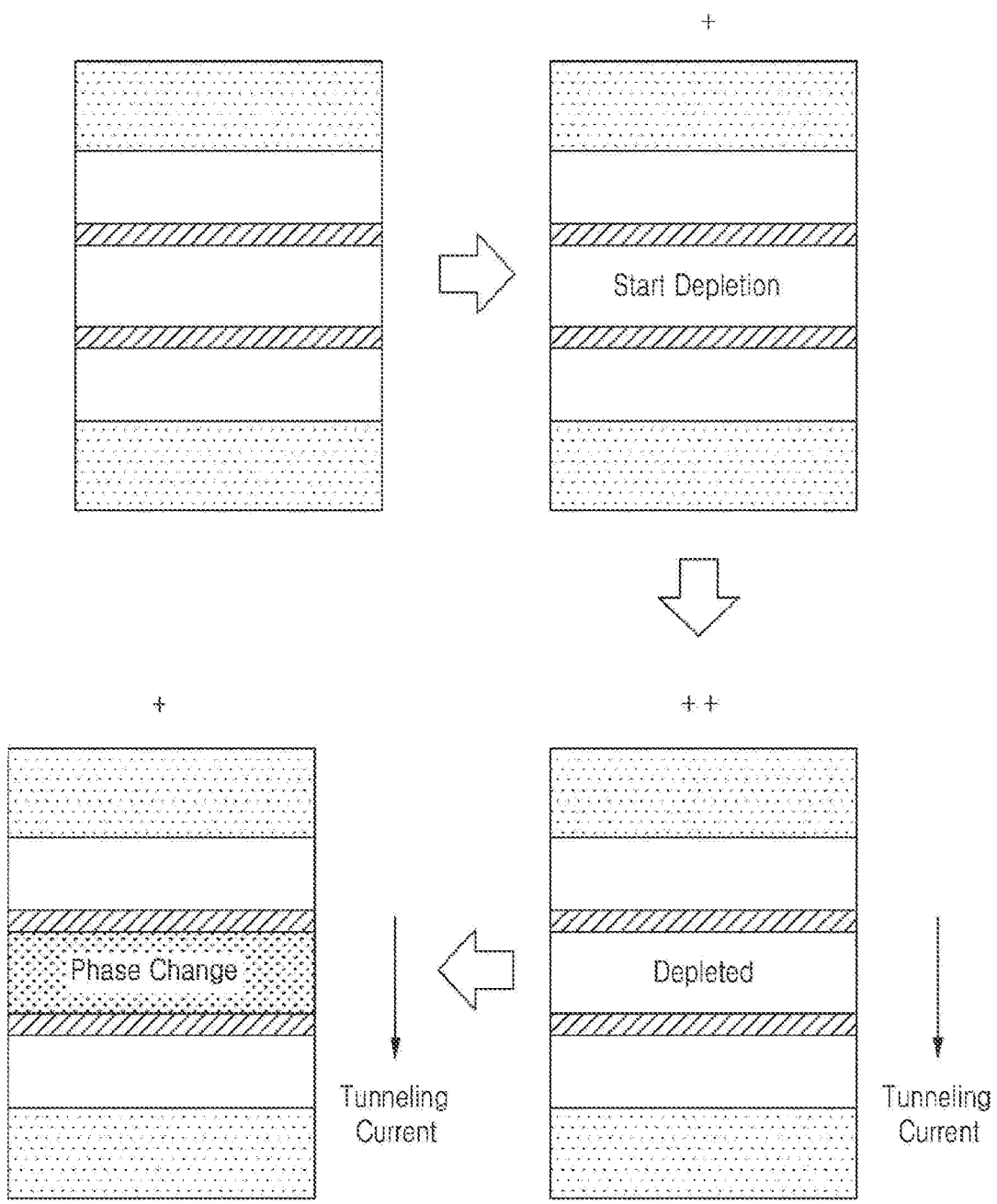
FIG. 5 is a diagram for explaining a write operation of a phase-change memory device according to an embodiment.
Figure 6:
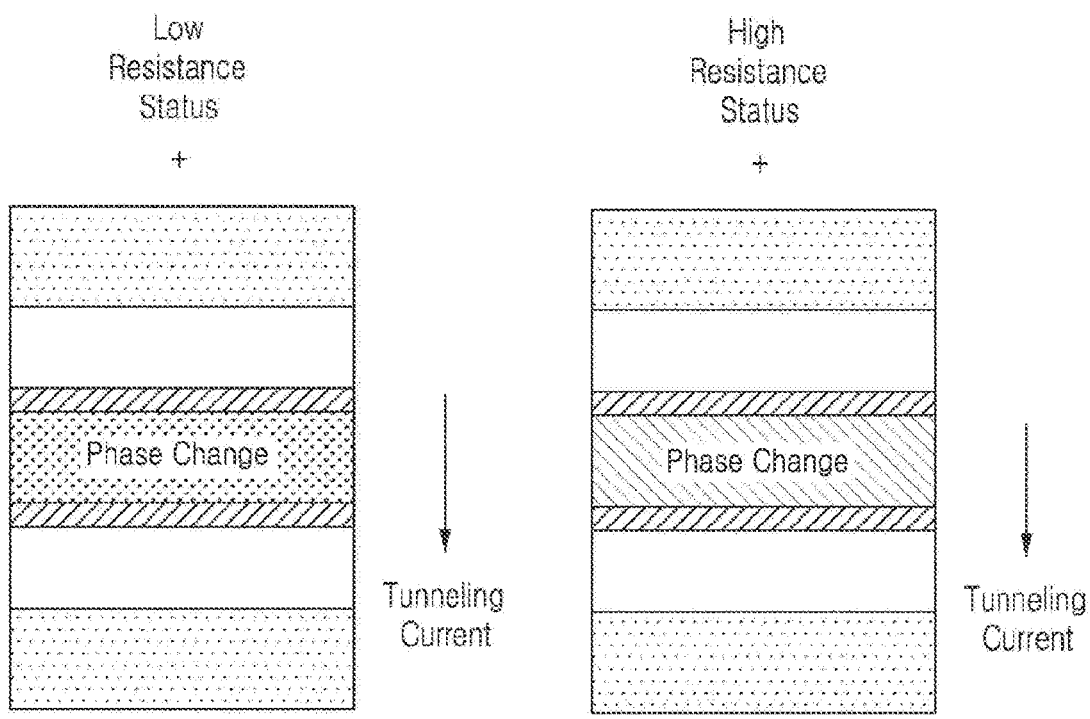
FIG. 6 is a diagram for explaining a read operation of a phase-change memory device according to an embodiment.

FIG. 5 is a diagram for explaining a write operation of a phase-change memory device according to an embodiment, and FIG. 6 is a diagram for explaining a read operation of a phase-change memory device according to an embodiment. More specifically, FIGS. 5 and 6 are diagrams for describing write and read operations of a phase-change memory device including the phase-change memory cell described above with reference to FIGS. 1A to 4.

Referring to FIG. 5, as an intermediate layer 510 is depleted due to an NP reverse bias in an NPN structure and a tunneling current flows, a phase-change memory cell according to an embodiment performs a write operation of changing a crystal state of the intermediate layer 510.

For example, when a reverse bias is applied in an NIP structure, which is formed by an upper layer 520, an upper tunneling thin film 530, and the intermediate layer 510 as shown in FIG. 5, the intermediate layer 510 is depleted. Thus, when the intermediate layer 510 is sufficiently depleted, as electrons of the upper layer 520 are tunneled through the upper tunneling thin film 530 into the intermediate layer 510, pass through the intermediate layer 510, and enter a lower tunneling thin film 540, the tunneling current flows. Thus, the write operation of changing the crystal state of the intermediate layer 510 according to a driving voltage (depending on a set voltage or a reset voltage) may be performed.

Referring to FIG. 6, in a phase-change memory cell according to an embodiment, when a crystal state of an intermediate layer 610 is changed in a low resistance status and a high resistance status as shown, a voltage difference which means a variation in a depletion turn-on voltage occurs. Thus, the phase-change memory cell according to the embodiment may perform a read operation using the characteristics. For example, the phase-change memory cell may perform a read operation by reading a voltage difference, which is caused by varying the depletion turn-on voltage according to a change of a crystal state of the intermediate layer 610.

In contrast, the phase-change memory cell may perform a read operation in a commonly used manner. For example, the phase-change memory cell may perform a read operation by directly reading a read current itself according to a variation in a resistance of the intermediate layer 610.

Figure 7:
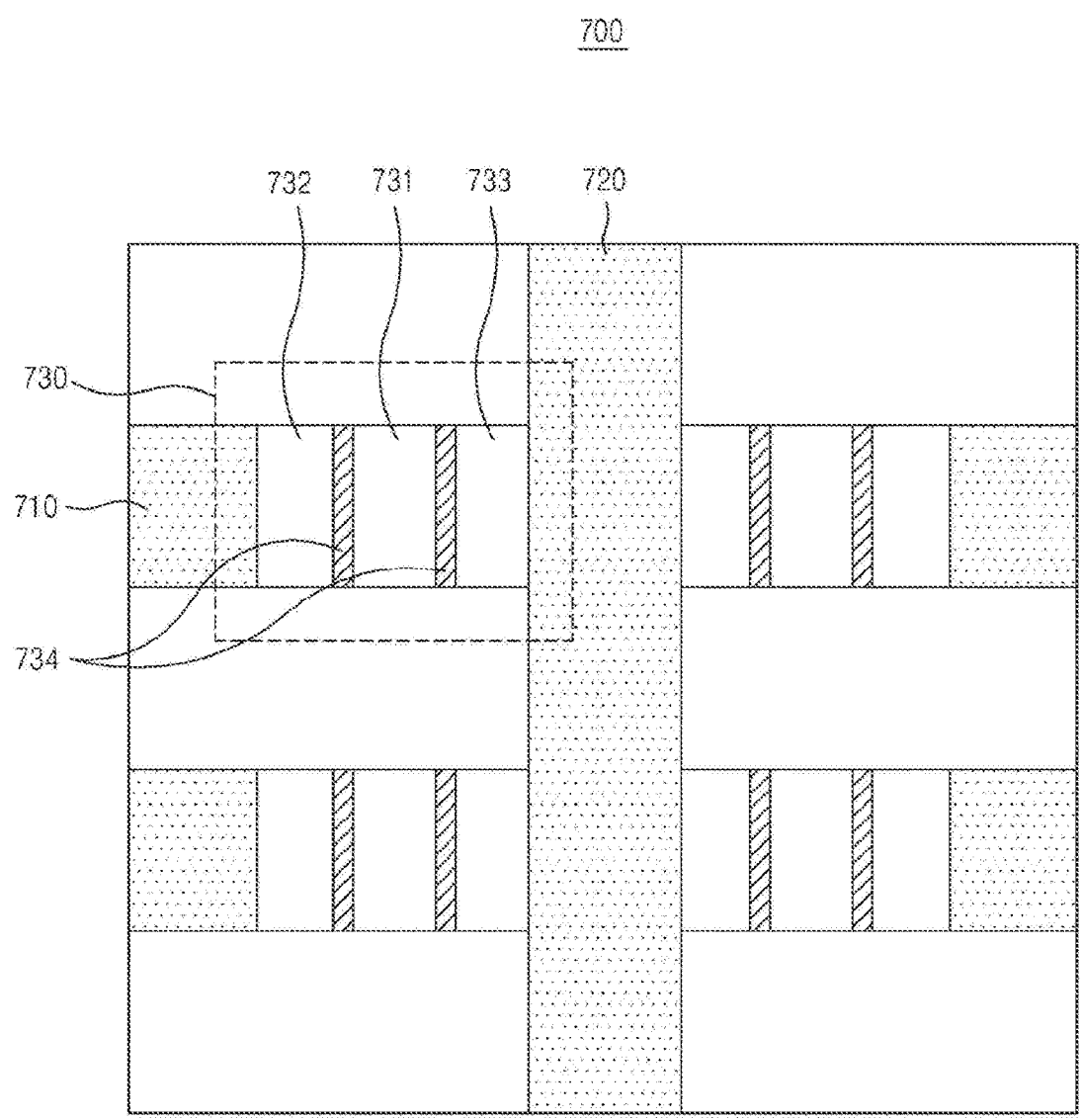
FIG. 7 is a diagram of a phase-change memory embodied to have a three-dimensional (3D) architecture, according to an embodiment.

FIG. 7 is a diagram of a phase-change memory embodied to have a 3D architecture, according to an embodiment. Hereinafter, the phase-change memory refers to a memory having a 3D architecture formed by combining a plurality of phase-change memory devices described above with reference to FIGS. 1A to 4.

Referring to FIG. 7, the phase-change memory 700 includes at least one first electrode 710 formed to extend in a horizontal direction, a second electrode 720 formed to extend in a direction perpendicular to the at least one first electrode 710, and at least one phase-change memory cell 730 interposed between the at least one first electrode 710 and the second electrode 720.

In the phase-change memory 700 having the structure described above, the at least one phase-change memory cell 730 corresponds to the phase-change memory cell described above with reference to FIGS. 1A to 4. That is, each of the at least one phase-change memory cell 730 may include a P-type intermediate layer 731 used as a data storage as a crystal state changes due to a voltage applied through the at least one first electrode 710 and the second electrode 720, an upper layer 732 and a lower layer 733 formed using an N-type semiconductor material at both ends of the intermediate layer 731, and at least one tunneling thin film 734 arranged in at least one area from among an area between the upper layer 732 and the intermediate layer 731 and an area between the lower layer 733 and the intermediate layer 731, so as to reduce a leakage current in the intermediate layer 731 or prevent intermixing between a P-type dopant and an N-type dopant.

Because each of the at least one phase-change memory cell 730 corresponds to the phase-change memory cell described above with reference to FIGS. 1A to 4, bi-directional current drive characteristics, characteristics of integrating a data storage function with a selection device function, and leakage current reduction characteristics, which are exhibited by the phase-change memory cell described with reference to FIGS. 1A to 4, may be equally applied to each of the at least one phase-change memory cell 730. A detailed description thereof will be omitted because it has been provided with reference to FIGS. 1A to 4.

Figure 8:
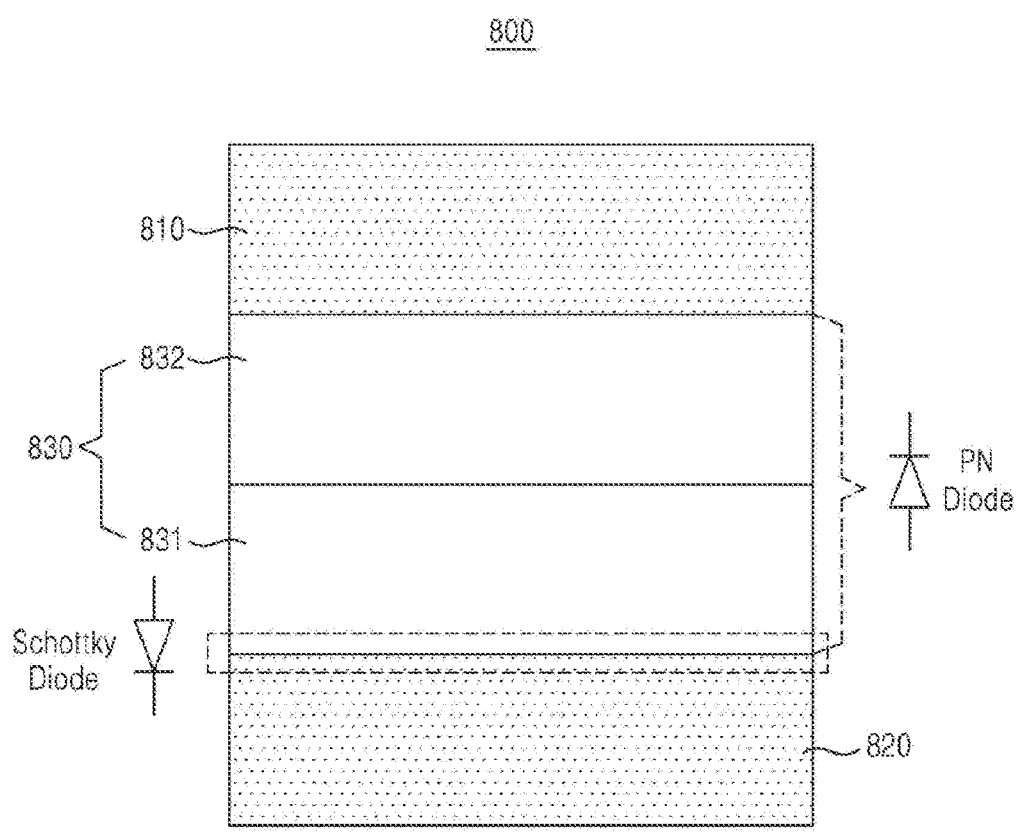
FIG. 8 is a diagram of a phase-change memory device according to an embodiment.
Figure 9:
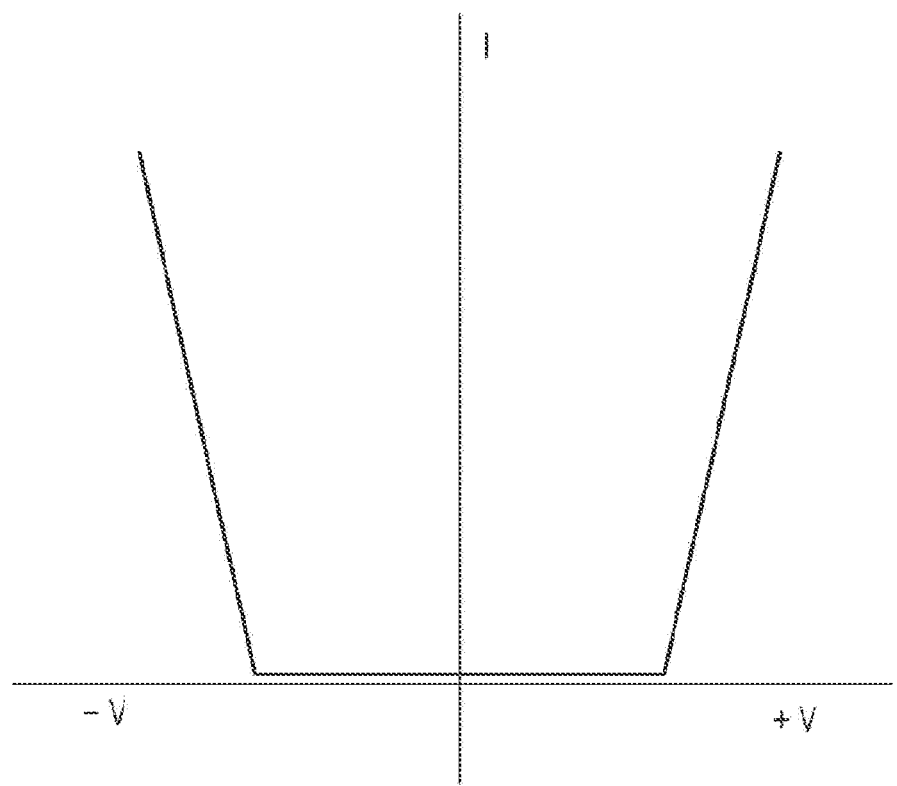
FIG. 9 is a diagram showing a phase-change memory device that implements bi-directional current drive according to an embodiment.
Figure 10:
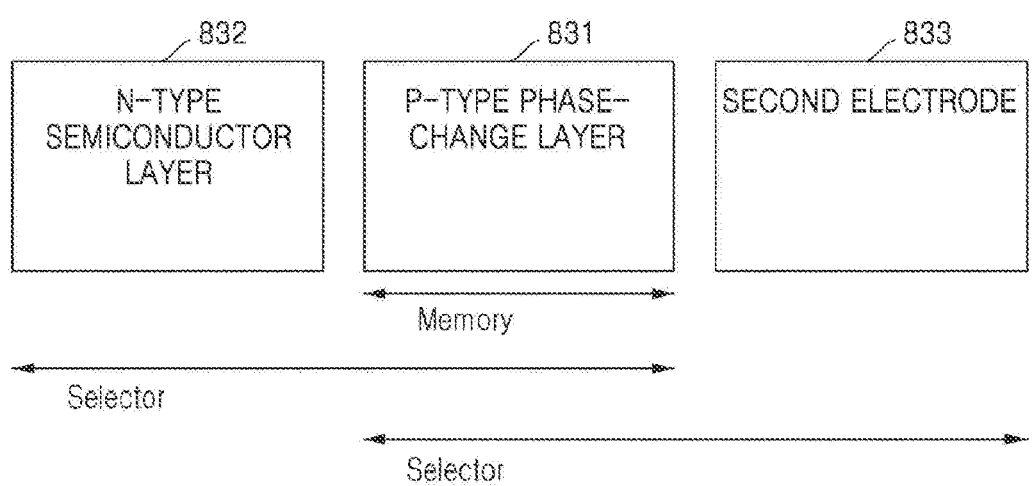
FIG. 10 is a diagram showing a selection device integrally implemented with a phase-change layer in a phase-change memory device according to an embodiment.
Figure 11:
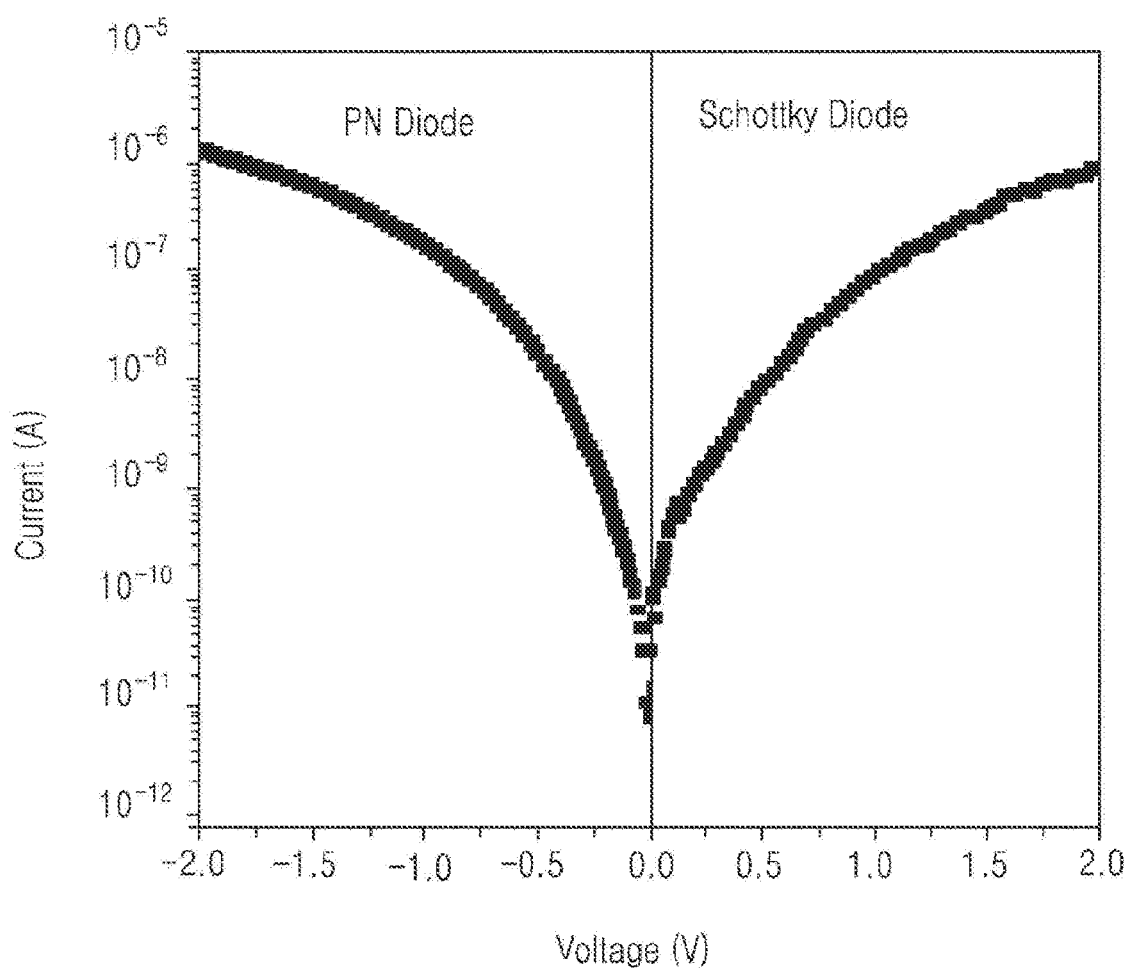
FIG. 11 is a diagram for explaining characteristics of a Schottky diode formed in a phase-change memory device according to an embodiment

FIG. 8 is a diagram of a phase-change memory device according to an embodiment. FIG. 9 is a diagram showing a phase-change memory device that implements bi-directional current drive according to an embodiment. FIG. 10 is a diagram showing a selection device integrally implemented with a phase-change layer in a phase-change memory device according to an embodiment. FIG. 11 is a diagram for explaining characteristics of a Schottky diode formed in a phase-change memory device according to an embodiment.

Referring to FIGS. 8 to 11, a phase-change memory device 800 according to an embodiment includes a first electrode 810 and a second electrode 820, which are formed using a conductive metal material, such as W, TaN, and TiN, and a phase-change memory cell 830 interposed therebetween.

The phase-change memory cell 830 has a structure including a P-type phase-change layer 831 used as a data storage as a crystal state changes due to a voltage applied through the first electrode 810 and the second electrode 820, and an N-type semiconductor layer 832 arranged on the P-type phase-change layer 831.

Thus, the P-type phase-change layer 831 and the N-type semiconductor layer 832 may form a PN diode, the P-type phase-change layer 831 may form a Schottky diode at a contact interface with the second electrode 820, and the phase-change memory cell 830 may implement bi-directional current drive shown in FIG. 9 using the PN diode and the Schottky diode, which are formed.

Here, the PN diode and the Schottky diode may be used as a selection device configured to selectively switch the voltage applied through the first electrode 810 and the second electrode 820 to the P-type phase-change layer 831.

Accordingly, the phase-change memory cell 830 may implement the PN diode and the Schottky diode, which operate as the selection device, based on the P-type phase-change layer 831 used as the data storage. Thus, a data storage function (or a function of representing data in a crystal state of the P-type phase-change layer 831, which is changed due to the voltage applied through the first electrode 810 and the second electrode 820) may be integrated with a function of the selection device (or a function of selectively switching the voltage applied through the first electrode 810 and the second electrode 820 to the P-type phase-change layer 831). That is, the P-type phase-change layer 831 may function as a data storage in the phase-change memory cell 830 as shown in FIG. 10, and also function as the selection device by forming the PN diode and the Schottky diode.

By integrally implementing the phase-change layer 831 with the selection device, the phase-change memory cell 830 may prevent and solve a disadvantage of being difficult in implementing high integration density in the scaling of a conventional OTS and a problem of material reliability due to the scaling.

Although the P-type phase-change layer 831 includes a phase-change material of which the crystal state changes between a crystalline state and an amorphous state due to the voltage applied through the first electrode 810 and the second electrode 820, the phase-change material does not have typical phase-change characteristics (or characteristics of having a low resistance in the crystalline state and having a high resistance in the amorphous state) but have reverse phase-change characteristics (or characteristics of having a high resistance in the crystalline state and having a low resistance in the amorphous state). Hereinafter, having the high resistance in the crystalline state will refer to having a relatively high resistance based on a resistance obtained in the amorphous state, while having the low resistance in the amorphous state will refer to having a relatively low resistance based on a resistance obtained in the crystalline state.

In particular, the P-type phase-change layer 831 may be formed by doping nitrogen into a phase-change material containing a transition metal to form a Schottky diode having stable Schottky characteristics at the contact interface with the second electrode 820. In this case, at least one of Ge, Sb, and Te may be used as the phase-change material, and at least one of Cr, Ti, Ni, Zn, Cu, and Mo may be used as the transition metal.

A content ratio at which the transition metal is contained in the phase-change material may be adjusted to maximize a resistance ratio between a case in which the phase-change layer 831 is in the crystalline state and a case in which the phase-change layer 831 is in the amorphous state. For example, a content ratio at which a transition metal, such as Cr (or Ti, Ni, Zn, Cu, Mo, or the like), is contained in a phase-change material, such as Ge and Te, may be adjusted to have a weight percentage of less than 10% based on Ge and Te to maximize the resistance ratio between the case in which the phase-change layer 831 is in the crystalline state and the case in which the phase-change layer 831 is in the amorphous state.

In addition, a concentration at which nitrogen is doped into the phase-change material containing the transition metal may be adjusted such that the P-type phase-change layer 831 forms the Schottky diode having the stable Schottky characteristics at the contact interface with the second electrode 820.

As described above, in the phase-change memory cell 830, the P-type phase-change layer 831 may be formed by doping nitrogen into the phase-change material containing the transition metal. Thus, the Schottky diode formed at the contact interface between the P-type phase-change layer 831 and the second electrode 820 may have the stable Schottky characteristics as shown in FIG. 11 and embody the same performance as the PN diode.

The N-type semiconductor layer 832 may be formed using an N-type oxide semiconductor material including at least one cation of Zn, In, and Ga, a Group-IV semiconductor material, or a Group III-V compound, which has low leakage current characteristics, and thus, excellent leakage current characteristics may be achieved with a wide bandgap. Here, a $ZnO_x$-based material having low leakage current characteristics may be used as the N-type oxide semiconductor material, and at least one of AZO, ZTO, IZO, ITO, IGZO, and Ag—ZnO may be used as the $ZnO_x$-based material.

As described above, the phase-change memory cell 830 according to the embodiment forms the PN diode and the Schottky diode based on the P-type phase-change layer 831 and the N-type semiconductor layer 832. Thus, the phase-change layer 831 used as the data storage may be integrally implemented with the selection device and simultaneously, bi-directional current drive may be implemented. Therefore, the phase-change memory cell 830 may prevent and solve a disadvantage of being difficult in implementing high integration density in the scaling of a conventional OTS and a problem of material reliability due to the scaling.

In addition, the phase-change memory cell 830 may block and prevent a leakage current by forming the N-type semiconductor layer 832 using low leakage current characteristics.

The above-described characteristics of the phase-change memory cell 830 may also be wholly applied to the phase-change memory cell 830 including the phase-change memory cell 830. Accordingly, the phase-change memory device 800 according to the embodiment may also integrally implement the phase-change layer 831 used as the data storage with the selection device and simultaneously, implement bi-directional current drive. Thus, a disadvantage of being difficult in implementing high integration density in the scaling of a conventional OTS and a problem of material reliability due to the scaling may be prevented and solved. Also, the N-type semiconductor layer 832 may be formed using a material having low leakage current characteristics, and thus, the leakage current may be blocked and prevented.

In addition, although the phase-change memory cell 830 and the phase-change memory device 800 including the same, which are explained above, have been described as simplified structures, they may be implemented to have a highly integrated 3D architecture. A detailed description thereof will be provided below.

Figure 12:
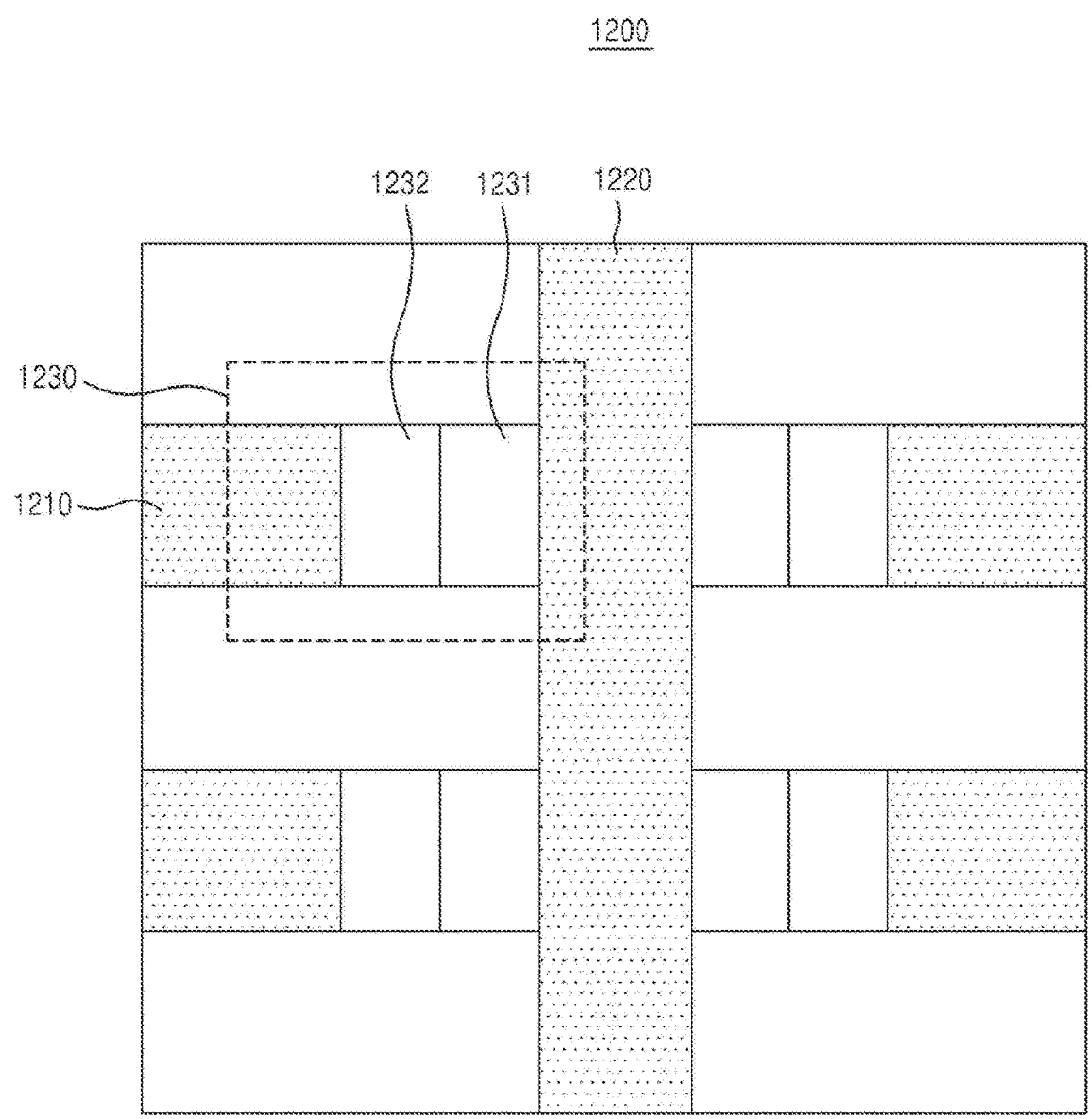
FIG. 12 is a diagram of a phase-change memory embodied to have a 3D architecture, according to an embodiment.

FIG. 12 is a diagram of a phase-change memory embodied to have a 3D architecture, according to an embodiment.

Referring to FIG. 12, a phase-change memory 1200 includes at least one first electrode 1210 formed to extend in a lateral direction, a second electrode 1220 formed to extend in a direction perpendicular to the at least one first electrode 1210, and at least one phase-change memory cell 1230 interposed between the at least one first electrode 1210 and the second electrode 1220.

In the phase-change memory 1200 having the above-described structure, the at least one phase-change memory cell 1230 corresponds to the phase-change memory cell described above with reference to FIGS. 8 to 11. That is, each of the at least one phase-change memory cell 1230 may include at least one P-type phase-change layer 1231, which is interposed between the at least one first electrode 1210 and the second electrode 1220 and used as a data storage as a crystal state changes due to a voltage applied through the at least one first electrode 1210 and the second electrode 1220, and at least one N-type semiconductor layer 1232, which is in contact with the at least one P-type phase-change layer 1231 and interposed between the at least one first electrode 1210 and the second electrode 1220. Thus, the at least one P-type phase-change layer 1231 and the at least one N-type semiconductor layer 1232 form a PN diode, and the at least one P-type phase-change layer 1231 forms a Schottky diode at a contact interface with the second electrode 1220.

A detailed description of each of the at least one phase-change memory cell 1230 including the at least one P-type phase-change layer 1231 and the at least one N-type semiconductor layer 1232 will be omitted because it has been provided with reference to FIGS. 8 to 12.

Figure 13:
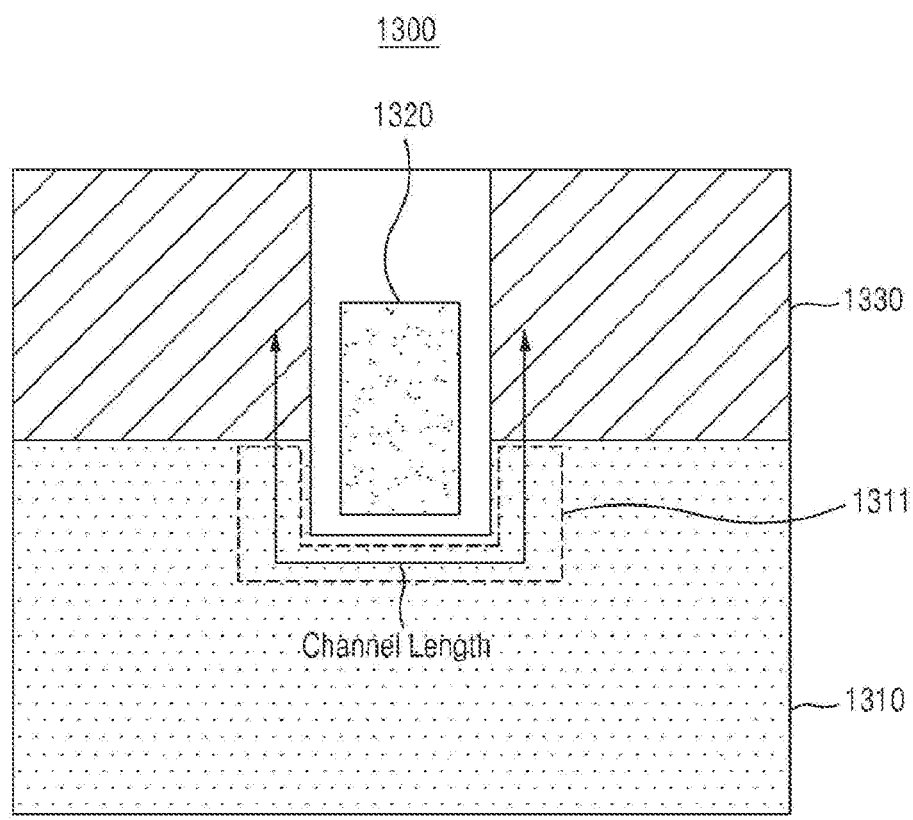
FIG. 13 is a diagram of a dynamic random access memory (DRAM) selection device according to an embodiment.
Figure 14:
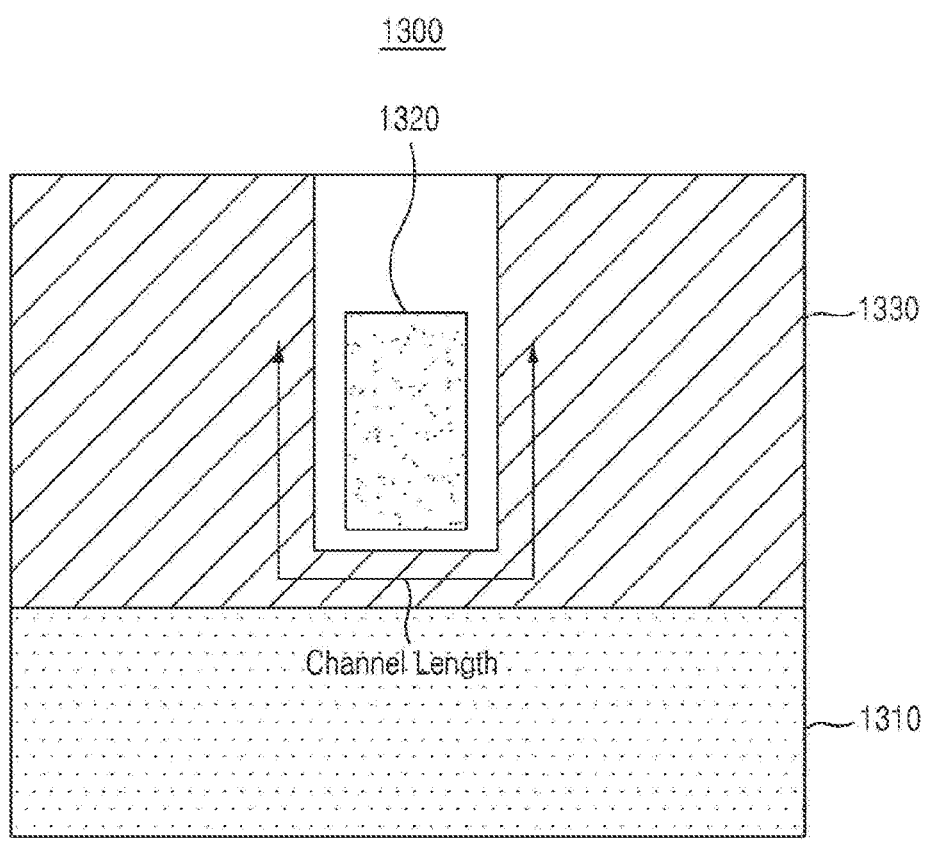
FIG. 14 is a diagram of the DRAM selection device shown in FIG. 13, according to another embodiment.
Figure 15A:
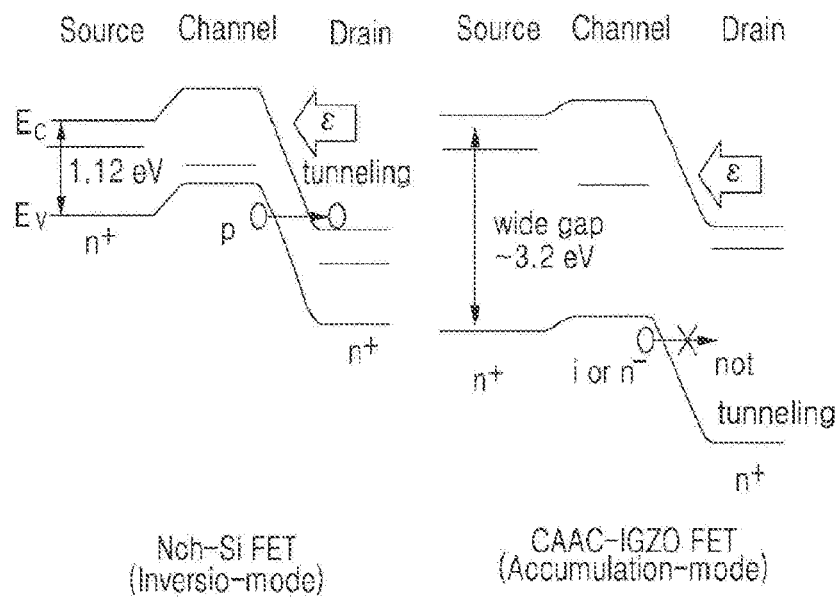
FIG. 15 is a diagram for explaining characteristics of an indium gallium zinc oxide (IGZO) channel structure included in a DRAM selection device according to an embodiment.
Figure 15B:
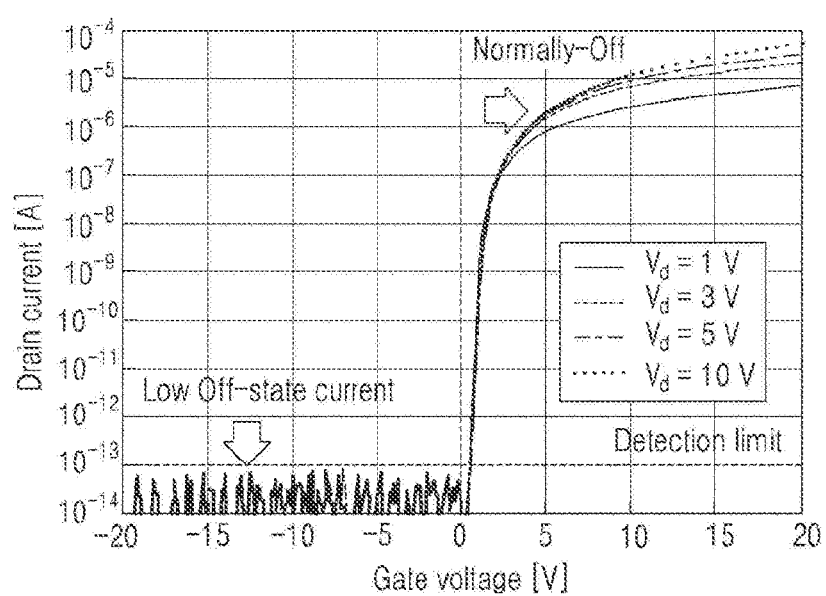

FIG. 13 is a diagram of a dynamic random access memory (DRAM) selection device according to an embodiment. FIG. 14 is a diagram of the DRAM selection device shown in FIG. 13, according to another embodiment. FIG. 15 is a diagram for explaining characteristics of an indium gallium zinc oxide (IGZO) channel structure included in a DRAM selection device according to an embodiment.

Referring to FIGS. 13 and 14, a DRAM selection device 1300 according to an embodiment includes a silicon substrate 1310, a word line 1320 buried in the silicon substrate 1310, and an IGZO channel structure 1330 formed in the silicon substrate 1310 to surround at least a portion of the word line 1320.

Here, the word line 1320 is buried in the silicon substrate 1310, and thus, a recessed channel array transistor (RCAT) and/or a buried word line (BWL) structure that increases a channel length may be applied. Because the word line 1320 has the same structure as a conventional RCAT and/or BWL, a detailed description thereof is omitted.

The IGZO channel structure 1330 is formed using an IGZO material (e.g., a $ZnO_x$-based material that is an oxide including at least one cation of Zn, In, and Ga) in the silicon substrate 1310 and used as at least a portion of a channel region in the DRAM selection device 1300. In an example, as the channel region of the DRAM selection device 1300, only the IGZO channel structure 1330 may be used or the IGZO channel structure 1330 and a partial area of the silicon substrate 1310 may be used. Hereinafter, although a case in which the IGZO channel structure 1330 is formed using the IGZO material has been described, the present disclosure is not limited thereto, and the IGZO channel structure 1330 may be formed using at least one of AZO, ZTO, IZO, ITO, IGZO, and Ag—ZnO.

In this case, whether the IGZO channel structure 1330 is used as a whole or a part of the channel region in the DRAM selection device 1300 depends on a depth at which the IGZO channel structure 1330 surrounds at least the portion of the word line 1320. For example, the IGZO channel structure 1330 has a depth of about ⅔ of a depth of the word line 1320 as shown in FIG. 13 and is formed to surround the word line 1320. Thus, the DRAM selection device 1300 of FIG. 13 may use the IGZO channel structure 1330 and a partial area 1311 of the silicon substrate 1310 as the channel region.

As another example, the IGZO channel structure 1330 has a depth greater than the depth of the word line 1320 as shown in FIG. 14 and is formed to surround the word line 1320, and thus, the DRAM selection device 1300 of FIG. 14 may use the IGZO channel structure 1330 as the whole of the channel region.

As described above, a depth at which the IGZO channel structure 1330 surrounds at least the portion of the word line 1320 may be determined as a value for allowing the IGZO channel structure 1330 to be used as at least the portion of the channel region in the DRAM selection device 1300. For example, the depth at which the IGZO channel structure 1330 surrounds at least the portion of the word line 1320 may be determined as a value greater than or equal to a threshold depth for allowing the IGZO channel structure 1330 to be used as at least the portion of the channel region in the DRAM selection device 1300.

In addition, the depth at which the IGZO channel structure 1330 surrounds at least the portion of the word line 1320 may be determined as a value for reducing a leakage current by a predetermined value or more in the DRAM selection device 1300. That is, because the IGZO channel structure 1330 has low leakage current characteristics as compared to the silicon substrate 1310, a depth of the IGZO channel structure 1330 may be determined such that a specific gravity of the IGZO channel structure 1330 on the channel region is increased more than that of the silicon substrate 1310 to suppress the leakage current to a target value on the channel region.

Because IGZO, which is a material forming the IGZO channel structure 1330, has a wider bandgap than silicon as shown in (a) of FIG. 15, IGZO has very low leakage current characteristics. Thus, the IGZO channel structure 13030 having low leakage current characteristics has current characteristics in a normal state as shown in (b) of FIG. 15.

Accordingly, the DRAM selection device 1300 according to the embodiment may use the IGZO channel structure 1330 having the above-described low leakage current characteristics as at least the portion of the channel region. Thus, the technical effect of making a substrate itself have extremely low leakage current characteristics may be achieved.

The IGZO channel structure 1330 may be formed in the silicon substrate 1310 by using an atomic layer deposition (ALD) process. The DRAM selection device 1300 including the IGZO channel structure formed using the ALD process may have the structure shown in FIGS. 13 and 14.

However, the present disclosure is not limited thereto, and the IGZO channel structure 1330 may be formed in the silicon substrate 1310 by using an epitaxial growth process. In this case, the DRAM selection device 1300 may further include a component for employing an epitaxial growth process. A detailed description thereof is presented with reference to FIG. 16.

In addition, the DRAM selection device 1300 according to an embodiment may be provided and stacked in plural in a vertical direction or a horizontal direction to form a 3D structure.

Figure 16:
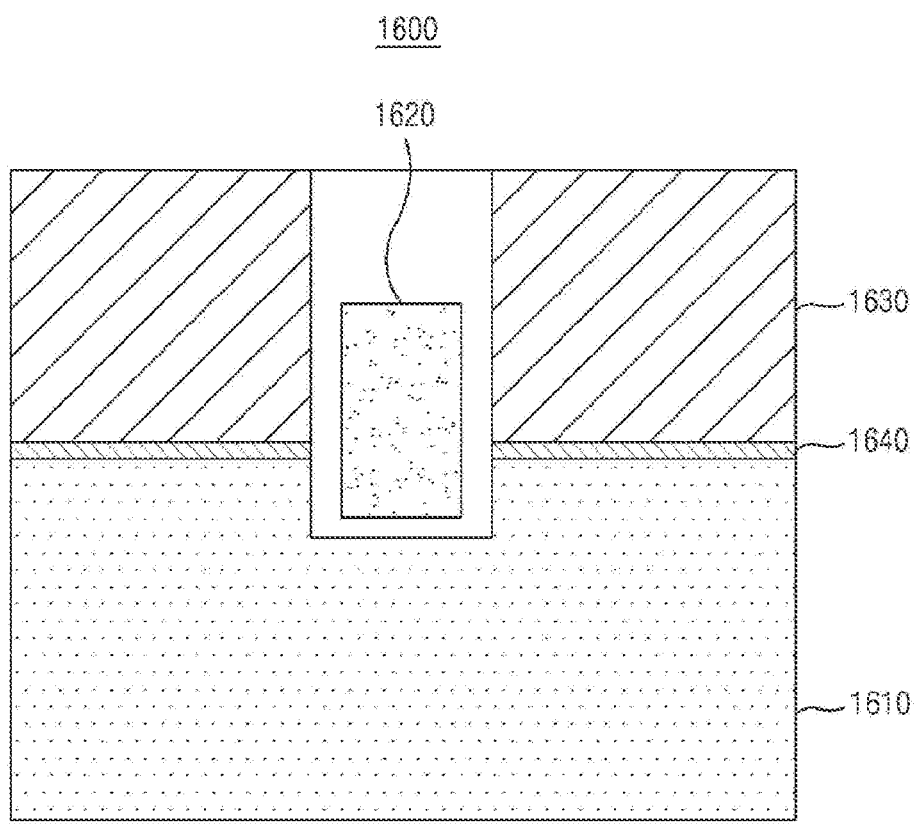
FIG. 16 is a diagram of a DRAM selection device according to another embodiment.

FIG. 16 is a diagram of a DRAM selection device according to another embodiment.

Referring to FIG. 16, a DRAM selection device 1600 according to another embodiment may include a silicon substrate 1610, a word line 1620 buried in the silicon substrate 1610, and an IGZO channel structure 1630 formed in a silicon substrate 410 to surround at least a portion of the word line 1620. Thus, the DRAM selection device 1600 may have a similar structure to the DRAM selection device 1300 shown in FIG. 13. However, the DRAM selection device 1600 of FIG. 16 differs from the DRAM selection device 1300 of FIG. 13 in that the DRAM selection device 1600 further includes an IGZO seed 440 used in an epitaxial growth process. That is, the DRAM selection device 1600 of FIG. 4 may use an epitaxial growth process based on an IGZO seed 1640 to form the IGZO channel structure 1630.

In the DRAM selection device 1600 of FIG. 16, other components excluding the IGZO seed 1640 are formed in the same structures to perform the same functions as other components of the DRAM selection device 1300 of FIG. 13, and thus, a detailed description thereof is omitted.

Figure 17:
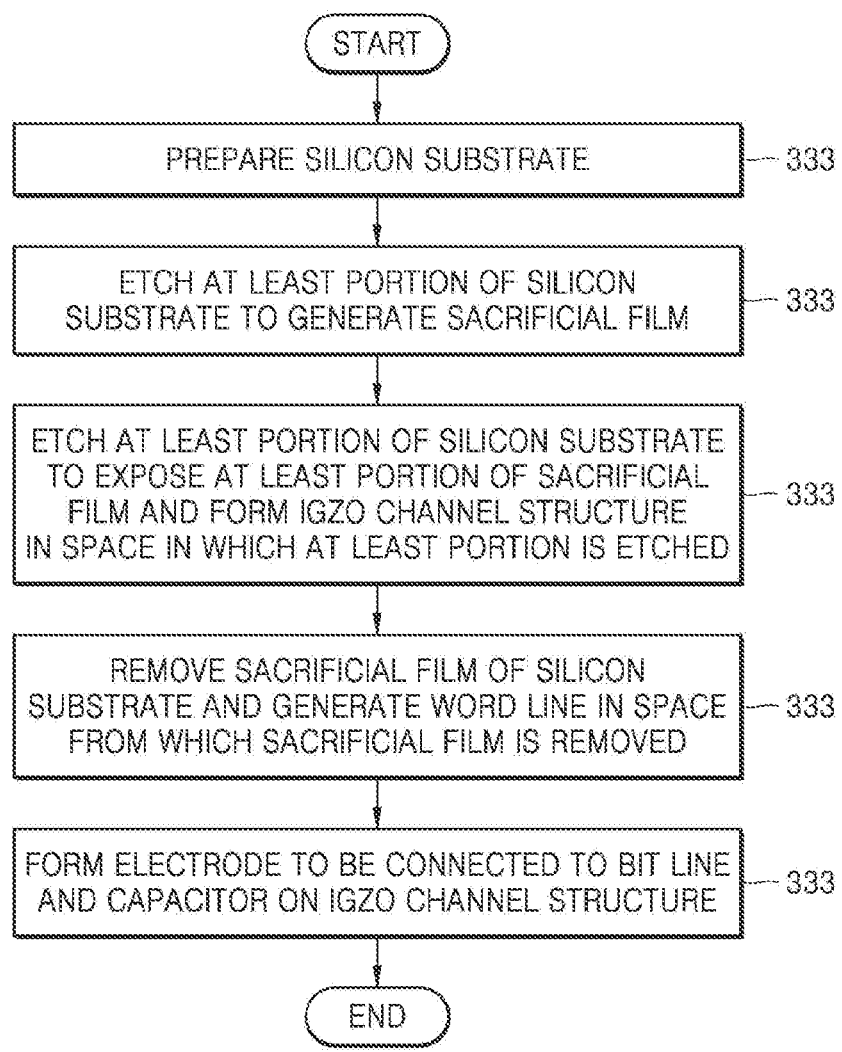
FIG. 17 is a flowchart of a method of manufacturing a DRAM selection device, according to an embodiment.

FIG. 17 is a flowchart of a method of manufacturing a dynamic random access memory (DRAM) selection device, according to an embodiment, and FIGS. 18 to 25 are diagrams of a method of manufacturing an DRAM selection device, according to an embodiment.

Hereinafter, the method of manufacturing the DRAM selection device, according to the embodiment, is assumed to be performed by a mechanized and automated manufacturing system.

Figure 18:
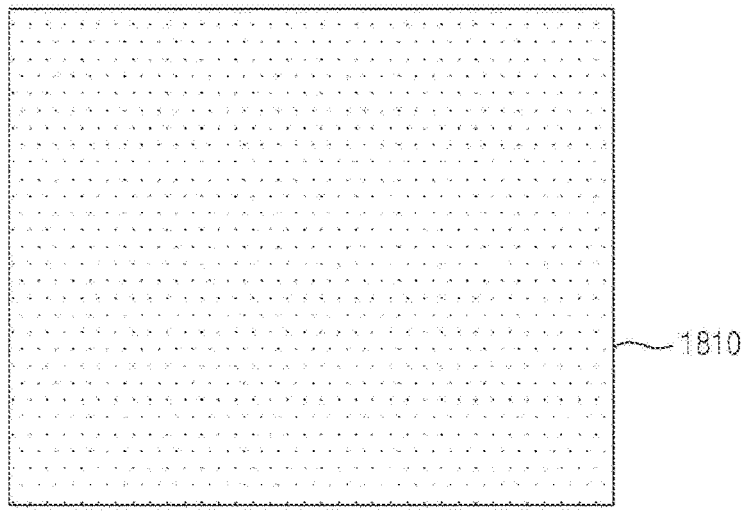
FIGS. 18 to 25 are diagrams for explaining a method of manufacturing a DRAM selection device, according to an embodiment.

Referring to FIG. 17, in operation S1710, the manufacturing system prepares a silicon substrate 1810 as shown in FIG. 18.

Figure 19:
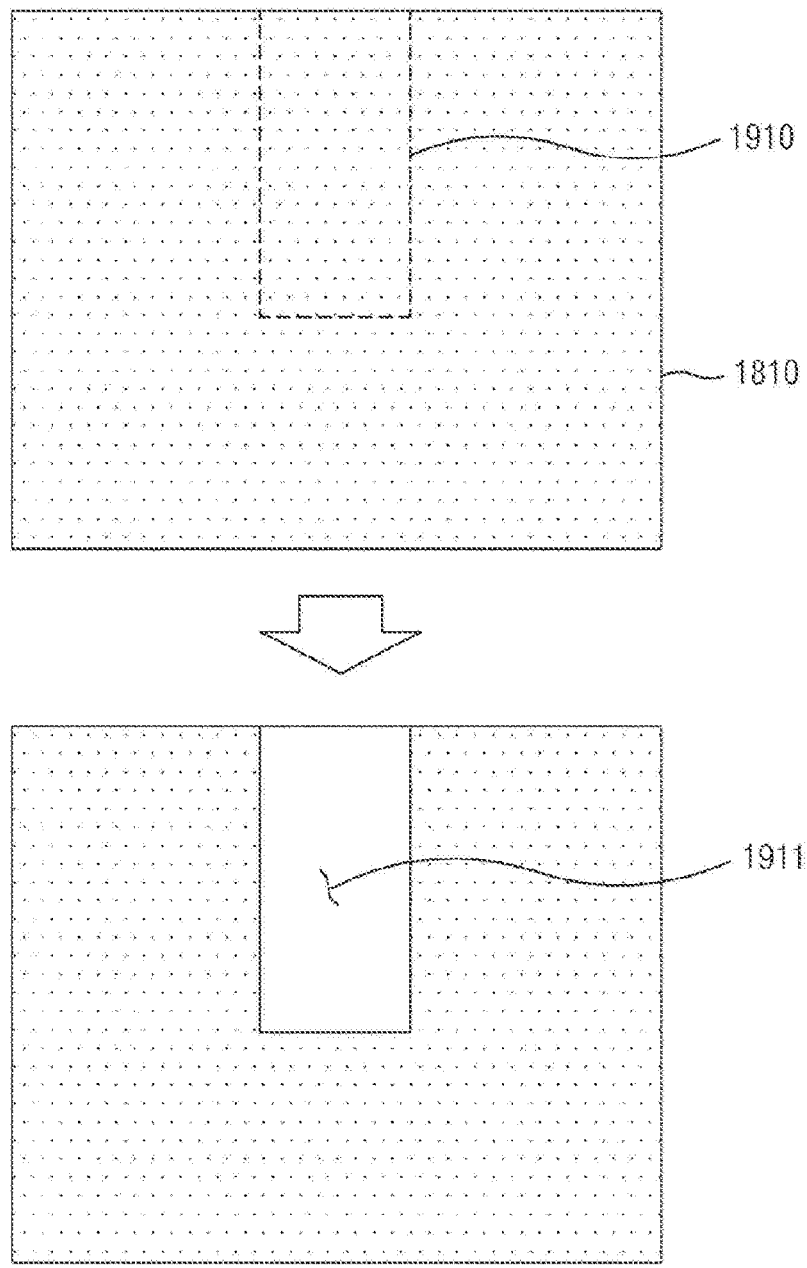
Figure 20:
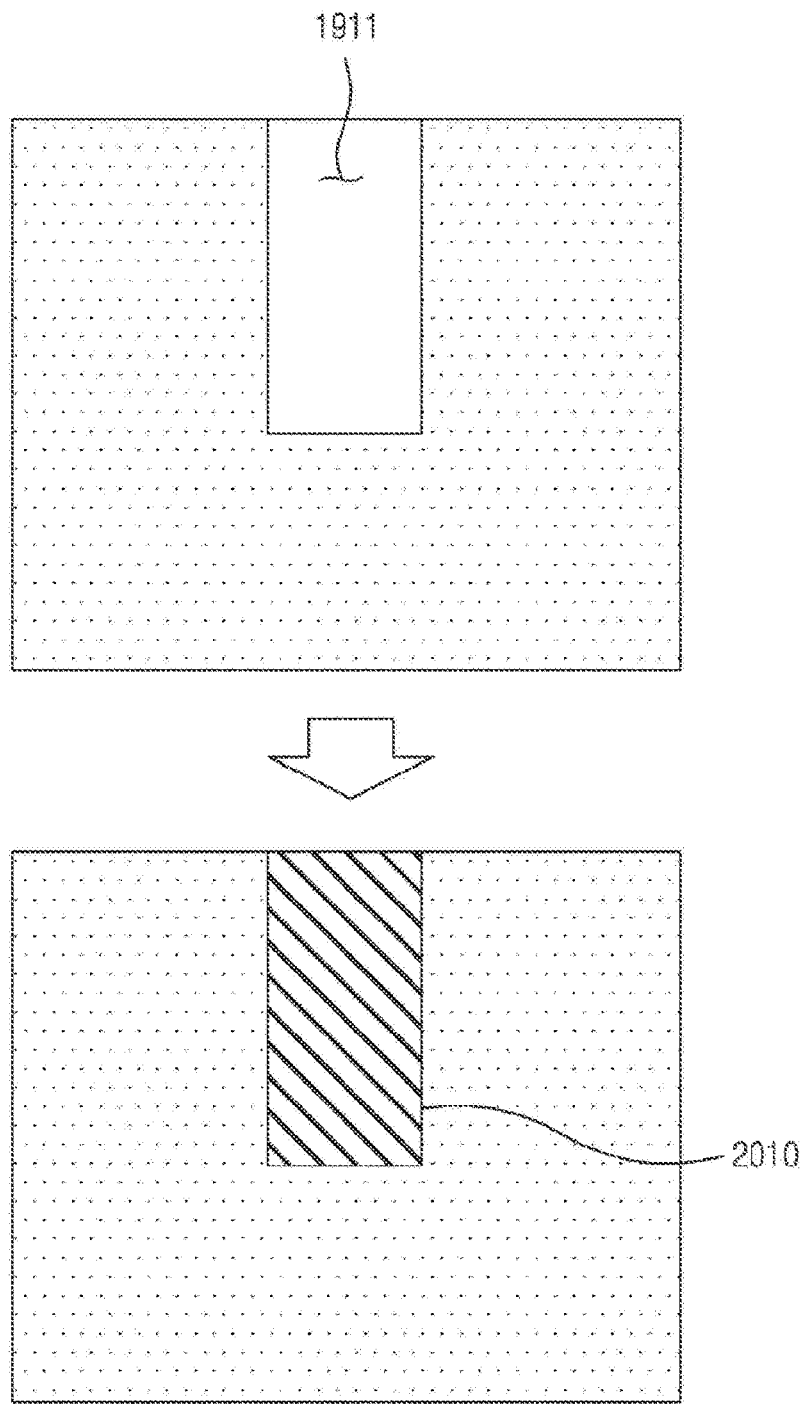

Thereafter, in operation S1720, the manufacturing system etches at least a portion 1910 of the silicon substrate 1810 and generates a sacrificial film 2010. For example, the manufacturing system etches at least the portion 1910 of the silicon substrate 1810 as shown in FIG. 19, and generates the sacrificial film 2010 in the etched space 1910 as shown in FIG. 20.

Figure 21:
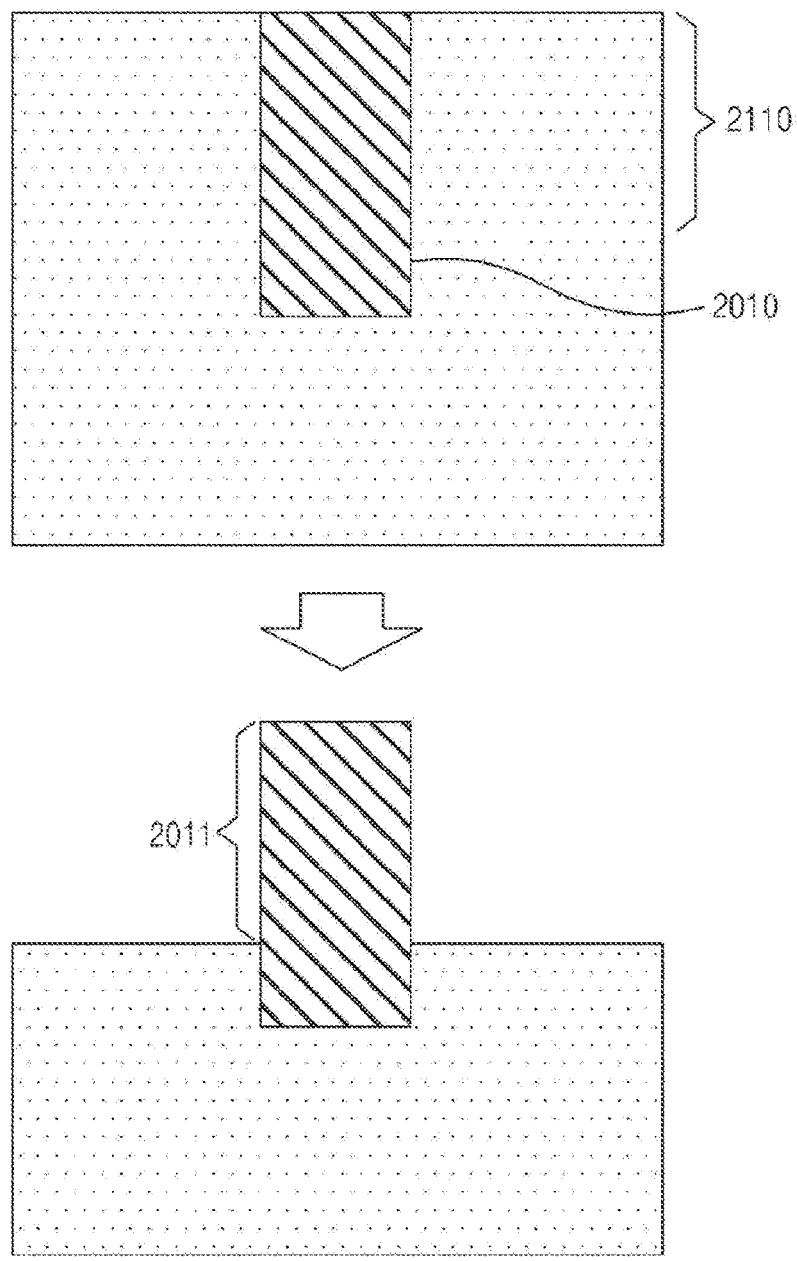
Figure 22:
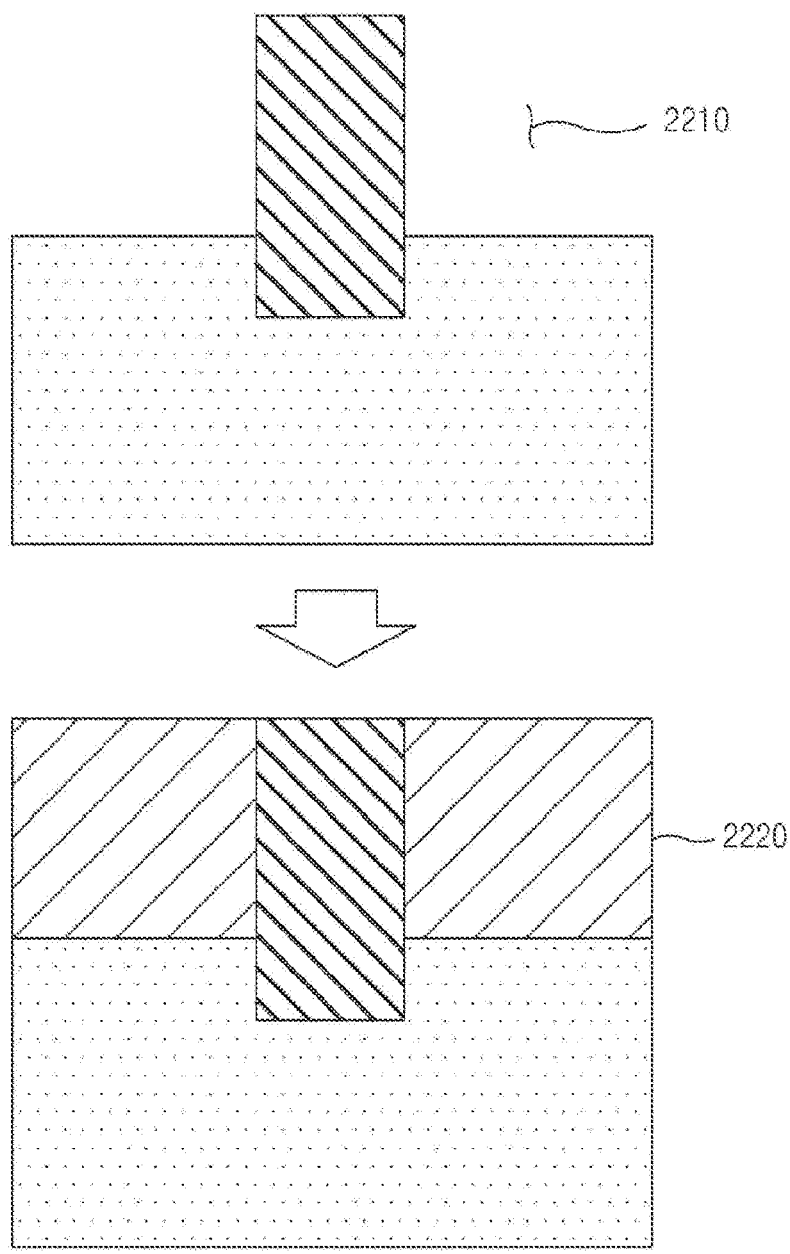

Next, in operation S1730, the manufacturing system etches at least a portion 2110 of the silicon substrate 1018 to expose at least a portion 2011 of the sacrificial film 2010, and form an IGZO channel structure 2220 in a space 2210 in which at least the portion 2110 is etched. For example, the manufacturing system may recess-etch at least the portion 2110 of the silicon substrate 1810 to expose the at least the portion 2011 of the sacrificial film 2010 as shown in FIG. 21, and form the IGZO channel structure 2220 by using an ALD process or an epitaxial growth process in the space 2210 in which at least the portion 2110 is etched, as shown in FIG. 22. When the IGZO channel structure 2220 is formed using an epitaxial growth process, the manufacturing system may generate an IGZO seed (not shown) used for an epitaxial growth process in the space 2210 of at least the etched portion 2110, and form the IGZO channel structure 2220 using the epitaxial growth process based on the IGZO seed. As described above, the IGZO channel structure 2220 used in operation S1730 may be used as at least a portion of a channel region in the DRAM selection device.

In this case, the manufacturing system may form the IGZO channel structure 2220 to surround at least a portion of a word line 2420, which is to be generated in operation S1740 described below. In particular, a depth at which the IGZO channel structure 2220 surrounds at least the portion of the word line 2420 may be determined a value for allowing the IGZO channel structure 2220 to be used as at least the portion of the channel region in the DRAM selection device and/or a value for reducing a leakage current by a predetermined value or more in the DRAM selection device.

Figure 23:
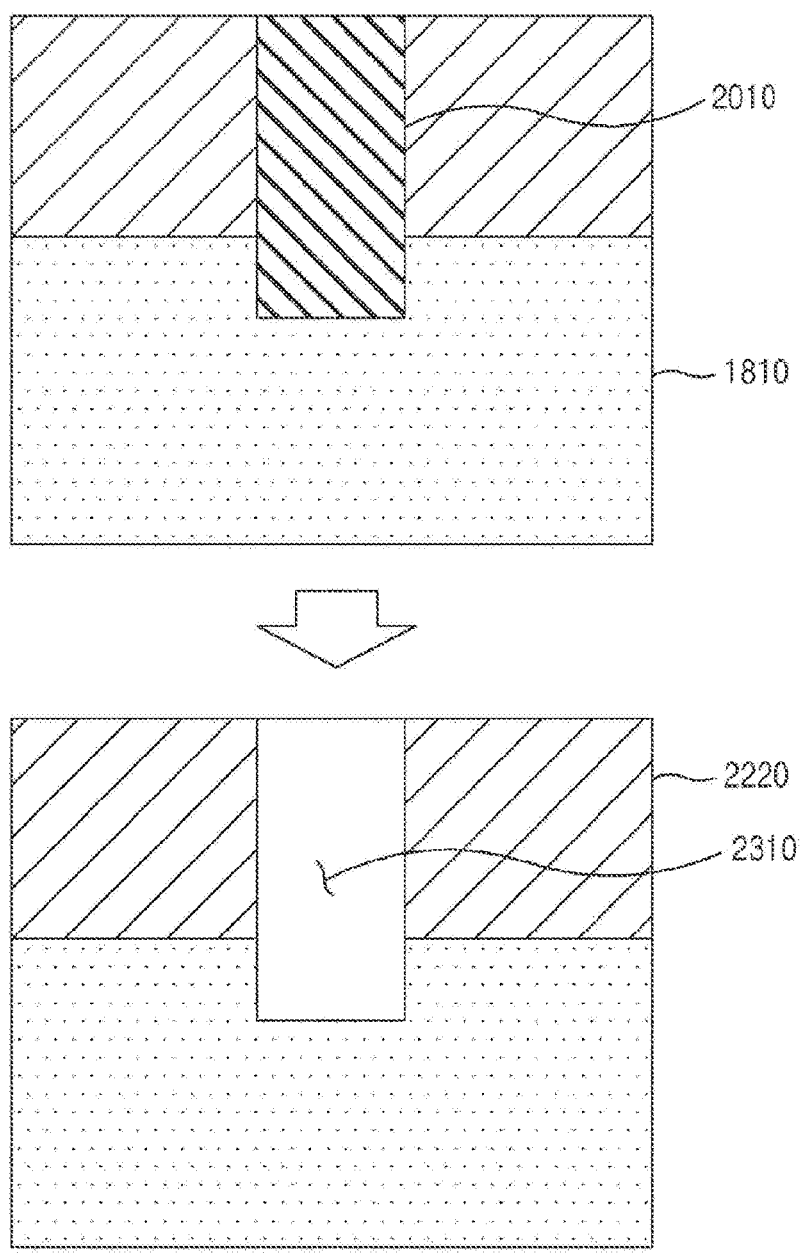
Figure 24:
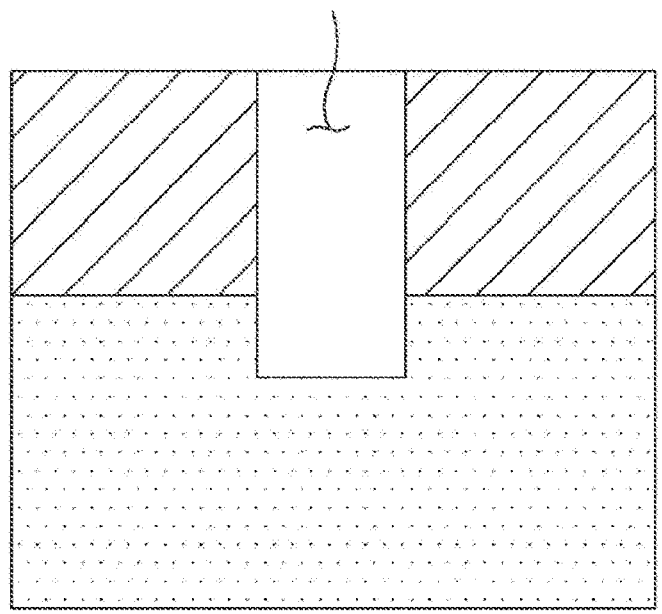
Figure 24:
Figure 24:
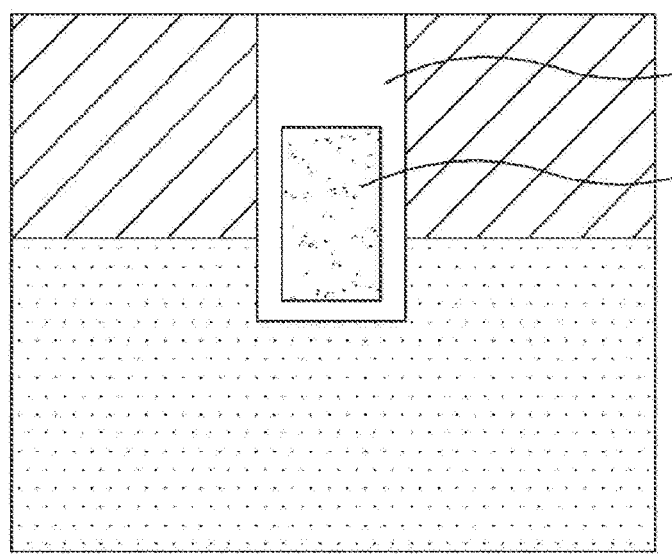

Next, in operation S1740, the manufacturing system removes the sacrificial film 2010 of the silicon substrate 1810 and generates the word line 2420 in a space 2310 from which the sacrificial film 2010 is removed. For example, the manufacturing system may remove the sacrificial film 2010 of the silicon substrate 1810 as shown in FIG. 23, and generate a gate oxide 2410 and the word line 2420 by forming films in the space 2310 from which the sacrificial film 2010 is removed, as shown in FIG. 24.

Figure 25:
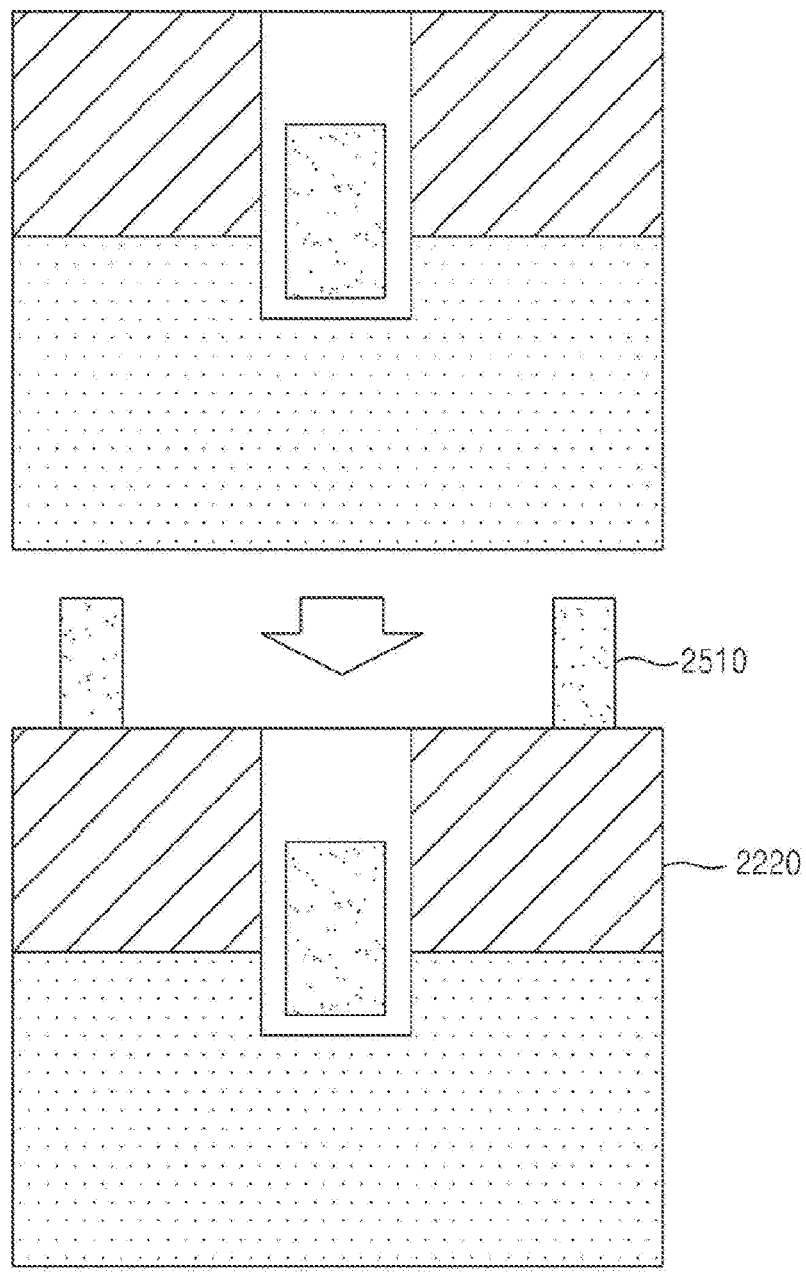

Thereafter, in operation S1750, the manufacturing system forms an electrode 2510 to be connected to a bit line and a capacitor on the IGZO channel structure 2220 as shown in FIG. 25.

From among the above-described operations S1710 to S1750, the operation of generating the sacrificial film 2010, the operation of generating the IGZO channel structure 2220, and the operation of generating the word line 2420 may be repeatedly performed a predetermined number of times on the silicon substrate 610 or repeatedly performed a predetermined number of times on other silicon substrates stacked on and under the silicon substrate 1810. Thus, a plurality of DRAM selection devices may be manufactured in a vertical direction or a horizontal direction to form a 3D structure.

Although the embodiments have been described above with reference to limited embodiments and drawings, it will be understood by one of ordinary skill in the art that various changes and modifications may be made therein from the above descriptions. For example, even when the described techniques are performed in different orders from the described methods and/or even when the described components (e.g., systems, structures, devices, circuits, and the like) are combined in different forms than in the described methods or are replaced with other components or equivalents, appropriate results may be achieved.

Therefore, other implementations, other embodiments, and equivalents to the claims also fall within the scope and spirit of the claims described below.

The invention claimed is:
1. A phase-change memory device comprising:
a first electrode;
a second electrode; and
a phase-change memory cell interposed between the first electrode and the second electrode,
wherein the phase-change memory cell comprises:
a P-type intermediate layer used as data storage as a crystal state changes due to a voltage applied through the first electrode and the second electrode;
an upper layer and a lower layer formed using an N-type semiconductor material at both ends of the intermediate layer; and
at least one tunneling thin film arranged in at least one area from among an area between the upper layer and the intermediate layer and an area between the lower layer and the intermediate layer, the at least one tunneling thin film being configured to reduce a leakage current in the intermediate layer or prevent intermixing between a P-type dopant and an N-type dopant.

2. The phase-change memory device of claim 1, wherein the at least one tunneling thin film is formed using a material to have a thickness to reduce the leakage current or prevent the intermixing between the P-type dopant and the N-type dopant and simultaneously allow a flow of a tunneling current.

3. The phase-change memory device of claim 1, wherein the phase-change memory cell is formed to have an NPN structure to selectively switch a voltage applied from the first electrode and the second electrode to the intermediate layer.

4. The phase-change memory device of claim 1, wherein the phase-change memory cell is configured to implement a bi-directional current drive by forming bi-directional PN diodes using an NPN structure.

5. The phase-change memory device of claim 1, wherein the phase-change memory cell is configured to perform a write operation of changing a crystal state of the intermediate layer as the intermediate layer is depleted due to an NP reverse bias in an NPN structure and a tunneling current flows.

6. The phase-change memory device of claim 1, wherein the phase-change memory cell is configured to perform a read operation of reading a voltage difference caused by a variation in a depletion turn-on voltage due to a change of a crystal state of the intermediate layer, or
perform a read operation of reading a read current according to a variation in a resistance of the intermediate layer.

7. The phase-change memory device of claim 1, wherein the intermediate layer is formed using a phase-change material containing a transition metal to have reverse phase-change characteristics.

8. A phase-change memory device comprising:
a first electrode;
a second electrode;
a P-type phase-change layer interposed between the first electrode and the second electrode, the P-type phase-change layer being used as a data storage as a crystal state changes due to a voltage applied through the first electrode and the second electrode; and
an N-type semiconductor layer arranged on the P-type phase-change layer,
wherein the P-type phase-change layer and the N-type semiconductor layer form a PN diode, and
the P-type phase-change layer forms a Schottky diode at a contact interface with the second electrode.

9. The phase-change memory device of claim 8, wherein the phase-change memory device is configured to implement bi-directional current drive using the PN diode and the Schottky diode.

10. The phase-change memory device of claim 8, wherein the P-type phase-change layer is formed by doping nitrogen into a phase-change material containing a transition metal to form a Schottky diode having stable Schottky characteristics at the contact interface with the second electrode.

11. A phase-change memory device comprising:
a first electrode;
a second electrode; and
a phase-change memory cell interposed between the first electrode and the second electrode,
wherein the phase-change memory cell comprises:
a first N-type semiconductor material layer;
a second N-type semiconductor material layer;
a P-type intermediate layer between the first and second N-type semiconductor material layers and used as data storage as a crystal state changes due to a voltage applied through the first electrode and the second electrode;
a first tunneling thin film arranged between the first N-type semiconductor material layer and the P-type intermediate layer, the first tunneling thin film configured to reduce a leakage current in the intermediate layer or prevent intermixing between a N-type dopant present in the first N-type semiconductor material layer and a P-type dopant present in the P-type intermediate layer.

12. The phase-change memory device of claim 11, further comprising:
a second tunneling thin film arranged between the second N-type semiconductor material layer and the P-type intermediate layer.

13. The phase-change memory device of claim 11, wherein the phase-change memory cell is formed to have an NPN structure to selectively switch a voltage applied from the first electrode and the second electrode to the P-type intermediate layer.

14. The phase-change memory device of claim 11, wherein the phase-change memory cell is configured to implement a bi-directional current drive by forming bi-directional PN diodes using an NPN structure.

15. The phase-change memory device of claim 11, wherein the phase-change memory cell is configured to perform a write operation of changing a crystal state of the P-type intermediate layer as the P-type intermediate layer is depleted due to an NP reverse bias in an NPN structure and a tunneling current flows.

16. The phase-change memory device of claim 11, wherein the P-type intermediate layer comprises phase-change material containing a transition metal and has reverse phase-change characteristics.

* * * * *